US012518692B2

(12) United States Patent
Choi et al.

(10) Patent No.: US 12,518,692 B2
(45) Date of Patent: Jan. 6, 2026

(54) DISPLAY DEVICE

(71) Applicant: Samsung Display Co., Ltd., Yongin-Si (KR)

(72) Inventors: Jieun Choi, Yongin-si (KR); Yongsung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/433,443

(22) Filed: Feb. 6, 2024

(65) Prior Publication Data

US 2024/0274078 A1 Aug. 15, 2024

(30) Foreign Application Priority Data

Feb. 7, 2023 (KR) ........................ 10-2023-0016399

(51) Int. Cl.
*G09G 3/3233* (2016.01)
*H10K 59/121* (2023.01)
*H10K 59/123* (2023.01)

(52) U.S. Cl.
CPC ....... *G09G 3/3233* (2013.01); *H10K 59/1213* (2023.02); *H10K 59/123* (2023.02); *G09G 2300/0426* (2013.01); *G09G 2300/0439* (2013.01); *G09G 2320/041* (2013.01)

(58) Field of Classification Search
CPC ... G09G 3/32–3291; G09G 2300/0426; G09G 2300/0439; G09G 2300/0809; G09G 2300/0819; G09G 2300/0842; G09G 2300/0861; G09G 2310/0243; G09G 2310/0251; G09G 2310/06; G09G 2310/061; G09G 2310/08; G09G 2320/0223; G09G 2320/0233; G09G 2320/04; G09G 2320/041; H10K 59/121–1213; H10K 59/123
See application file for complete search history.

(56) References Cited

U.S. PATENT DOCUMENTS

| | | | | |
|---|---|---|---|---|
| 8,558,767 | B2 | 10/2013 | Kwon | |
| 2006/0022907 | A1* | 2/2006 | Uchino | G09G 3/3233 345/76 |
| 2020/0410932 | A1* | 12/2020 | Kobayashi | G09G 3/3233 |
| 2021/0225275 | A1* | 7/2021 | Cho | G09G 3/3233 |
| 2021/0367122 | A1* | 11/2021 | Park | G09G 3/3233 |
| 2023/0298521 | A1* | 9/2023 | Choi | G09G 3/3233 |

FOREIGN PATENT DOCUMENTS

| | | | |
|---|---|---|---|
| KR | 10-0893482 | B1 | 4/2009 |

* cited by examiner

*Primary Examiner* — Nathan Danielsen
(74) *Attorney, Agent, or Firm* — Innovation Counsel LLP

(57) ABSTRACT

A display device includes a first pixel circuit and a second pixel circuit. The first pixel circuit includes a driving transistor generating a driving current, a temperature compensation transistor connected to the driving transistor, and a light emitting element connected to the temperature compensation transistor and emitting light according to the driving current.

18 Claims, 22 Drawing Sheets

ACT1:BP1,EP1,IP

CL2:MG1,MG2,MG3

BML+ACT1+CL1+CL2+ACT2+CL3+CL4+CL5

DISPLAY DEVICE

CROSS-REFERENCE TO RELATED APPLICATION

This application claims priority under 35 USC § 119 to Korean Patent Application No. 10-2023-0016399, filed on Feb. 7, 2023, in the Korean Intellectual Property Office, the content of which is herein incorporated by reference in its entirety.

BACKGROUND

1. Field

The present disclosure relates generally to a display device. More particularly, the present disclosure relates to a display device that provides visual information.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), quantum dot display device or the like is increasing.

As the display device is driven, a temperature difference between sub-pixels may occur. In this case, a luminance difference between the sub-pixels may occur.

SUMMARY

Embodiments provide a display device that reduces a luminance difference.

A display device according to an embodiment of the present disclosure includes a first pixel circuit and a second pixel circuit. The first pixel circuit includes a driving transistor generating a driving current, a temperature compensation transistor including a first electrode connected to a first node, a gate electrode connected to the first node, and a second electrode connected to a second node, the temperature compensation transistor which is connected to the driving transistor through the second node, a light emitting element connected to the temperature compensation transistor through the second node and emitting light according to the driving current.

In an embodiment, the temperature compensation transistor may be a PMOS transistor.

In an embodiment, the first pixel circuit may further include an anode initialization transistor including a first electrode receiving an anode initialization voltage, a gate electrode receiving a bias gate signal, and a second electrode connected to the first node. In addition, the anode initialization transistor may be connected to the temperature compensation transistor through the first node.

In an embodiment, a voltage provided to the second node may be greater than the anode initialization voltage.

In an embodiment, a voltage provided to the second node when driven at a first temperature may be greater than a voltage provided to the second node when driven at a second temperature greater than the first temperature.

In an embodiment, the driving transistor may include a first electrode connected to a third node, a gate electrode connected to a gate node, and a second electrode connected to a fourth node. In addition, the first pixel circuit may further include a compensation transistor including a first electrode connected to the gate node, a gate electrode receiving a compensation gate signal, and a second electrode connected to the fourth node, and the compensation transistor may be connected to the driving transistor through the fourth node and the gate node.

In an embodiment, the first pixel circuit may further include a gate initialization transistor including a first electrode receiving a gate initialization voltage, a gate electrode receiving an initialization gate signal, and a second electrode connected to the gate node, and the gate initialization transistor may be connected to each of the compensation transistor and the driving transistor through the gate node.

In an embodiment, each of the compensation transistor and the gate initialization transistor may be a NMOS transistor.

In an embodiment, the first pixel circuit may further include a first light emitting transistor and a second light emitting transistor. The first light emitting transistor may include a first electrode receiving a driving voltage, a gate electrode receiving a light emitting control signal, and a second electrode connected to the third node, and the first light emitting transistor may be connected to the driving transistor through the third node. In addition, the second light emitting transistor may include a first electrode connected to the fourth node, a gate electrode receiving the light emitting control signal, and a second electrode connected to the second node, and the second light emitting transistor may be connected to the driving transistor through the fourth node.

In an embodiment, the first pixel circuit may further include a writing transistor and an initialization transistor. The writing transistor may include a first electrode receiving a data voltage, a gate electrode receiving a write gate signal, and a second electrode connected to the third node, and the writing transistor may be connected to the driving transistor through the third node. In addition, the initialization transistor may include a first electrode receiving a bias voltage, a gate electrode receiving the bias gate signal, and a second electrode connected to the third node, and the initialization transistor may be connected to the driving transistor through the third node.

In an embodiment, the second pixel circuit may include a second driving transistor generating a second driving current, a second temperature compensation transistor including a first electrode connected to a first node of the second pixel circuit, a gate electrode connected to the first node of the second pixel circuit, and a second electrode connected to a second node of the second pixel circuit, the second temperature compensation transistor being connected to the second driving transistor through the second node of the second pixel circuit, and a second light emitting element connected to the second temperature compensation transistor through the second node of the second pixel circuit and emitting light according to the driving current. In addition, a ratio of a channel width to a channel length (W/L ratio) of the temperature compensation transistor included in the first pixel circuit may be different from a ratio of a channel width to a channel length of the second temperature compensation transistor included in the second pixel circuit.

A display device according to another embodiment of the present disclosure includes a first pixel circuit and a second pixel circuit. The first pixel circuit includes a driving transistor generating a driving current, an anode initialization transistor including a first electrode connected to a first node, a gate electrode receiving a bias gate signal, and a second electrode connected to a second node, the anode initialization transistor being connected to the driving transistor through the second node, a temperature compensation transistor including a first electrode receiving an anode initialization voltage, a gate electrode receiving the anode initialization voltage, and a second electrode connected to the first node, the temperature compensation transistor being connected to the anode initialization transistor through the first node, and a light emitting element connected to the anode initialization transistor through the second node and emitting light according to the driving current.

In an embodiment, the temperature compensation transistor may be a PMOS transistor.

In an embodiment, a voltage provided to the second node may be greater than the anode initialization voltage.

In an embodiment, a voltage provided to the second node when driven at a first temperature may be greater than a voltage provided to the second node when driven at a second temperature greater than the first temperature.

In an embodiment, the driving transistor may include a first electrode connected to a third node, a gate electrode connected to a gate node, and a second electrode connected to a fourth node. In addition, the first pixel circuit may further include a compensation transistor and a gate initialization transistor. The compensation transistor may include a first electrode connected to the gate node, a gate electrode receiving a compensation gate signal, and a second electrode connected to the fourth node, and the compensation transistor may be connected to the driving transistor through the fourth node and the gate node. The gate initialization transistor may include a first electrode receiving a gate initialization voltage, a gate electrode receiving an initialization gate signal, and a second electrode connected to the gate node, and the gate initialization transistor may be connected to each of the compensation transistor and the driving transistor through the gate node.

In an embodiment, each of the compensation transistor and the gate initialization transistor may be a NMOS transistor.

In an embodiment, the first pixel circuit may further include a first light emitting transistor and a second light emitting transistor. The first light emitting transistor may include a first electrode receiving a driving voltage, a gate electrode receiving a light emitting control signal, and a second electrode connected to the third node, and the first light emitting transistor may be connected to the driving transistor through the third node. In addition, the second light emitting transistor may include a first electrode connected to the fourth node, a gate electrode receiving the light emitting control signal, and a second electrode connected to the second node, and the second light emitting transistor may be connected to the driving transistor through the fourth node.

In an embodiment, the first pixel circuit may further include a writing transistor and an initialization transistor. The writing transistor may include a first electrode receiving a data voltage, a gate electrode receiving a write gate signal, and a second electrode connected to the third node, and the writing transistor may be connected to the driving transistor through the third node. In addition, the initialization transistor may include a first electrode receiving a bias voltage, a gate electrode receiving the bias gate signal, and a second electrode connected to the third node, and the initialization transistor may be connected to the driving transistor through the third node.

In an embodiment, the second pixel circuit may include a second driving transistor generating a second driving current, a second anode initialization transistor including a first electrode connected to a first node of the second pixel circuit, a gate electrode receiving the bias gate signal, and a second electrode connected to a second node of the second pixel circuit, the second anode initialization transistor being connected to the second driving transistor through the second node, a second temperature compensation transistor including a first electrode receiving the anode initialization voltage, a gate electrode receiving the anode initialization voltage, and a second electrode connected to the first node of the second pixel circuit, the second temperature compensation transistor being connected to the second anode initialization transistor through the first node of the second pixel circuit, and a second light emitting element connected to the second anode initialization transistor through the second node of the second pixel circuit and emitting light according to the driving current. In addition, a ratio of a channel width to a channel length (W/L ratio) of the temperature compensation transistor included in the first pixel circuit may be different from a ratio of a channel width to a channel length of the second temperature compensation transistor included in the second pixel circuit.

A display device according to embodiments of the present disclosure may include an anode initialization transistor, a light emitting element, and a temperature compensation transistor connected to each of the anode initialization transistor and the light emitting element. When the display device is driven at a relatively high temperature, the second temperature compensation transistor may reduce an increase in current flowing into the light emitting element.

Accordingly, a problem in which a luminance difference between sub-pixels occurs depending on temperature may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
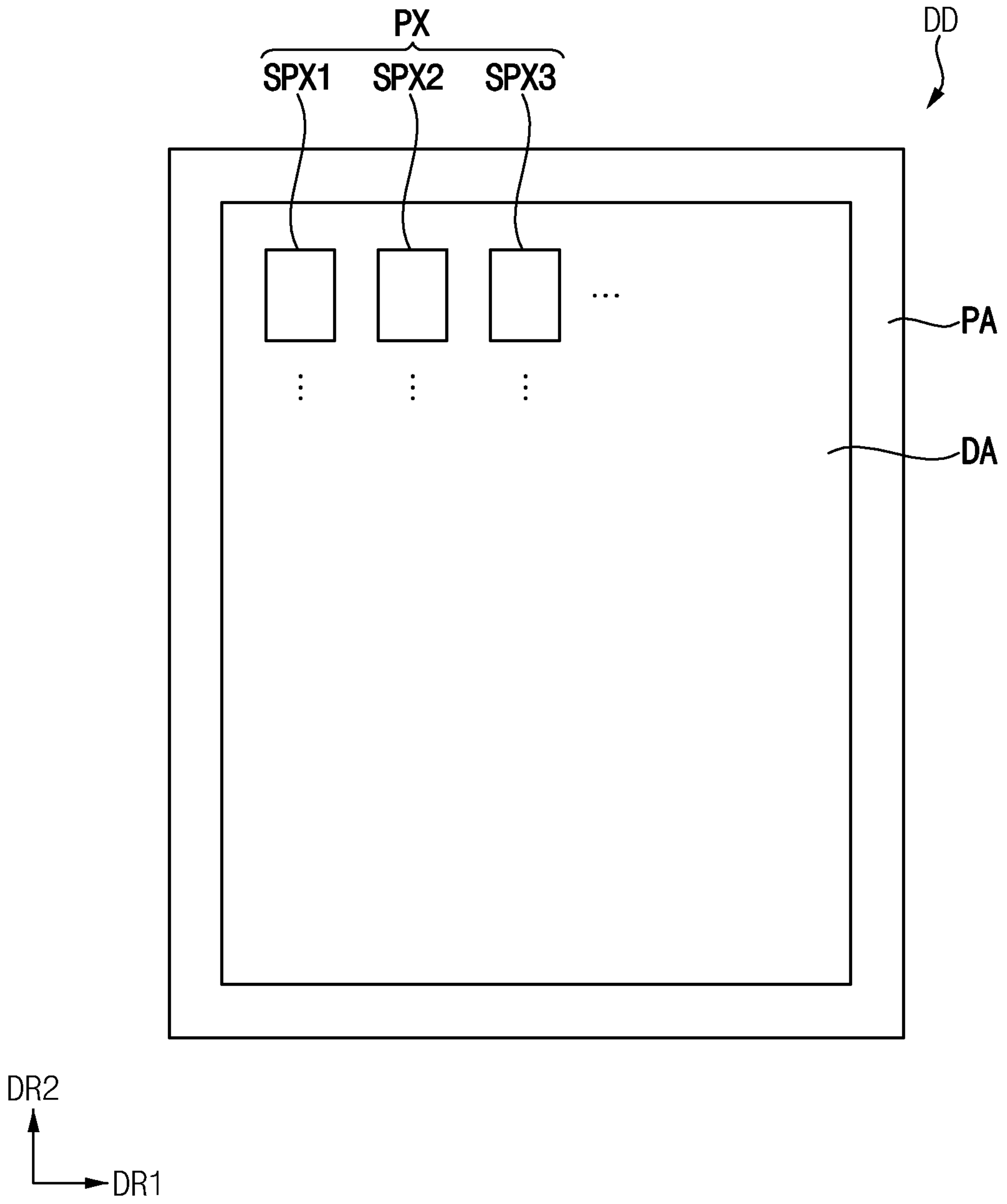
FIG. 1 is a plan view illustrating a display device according to an embodiment of the present disclosure.

Hereinafter, embodiments of the present disclosure will be described in detail with reference to the accompanying drawings. The same reference numerals are used for the same components in the drawings, and redundant descriptions of the same components will be omitted.

Figure 2:
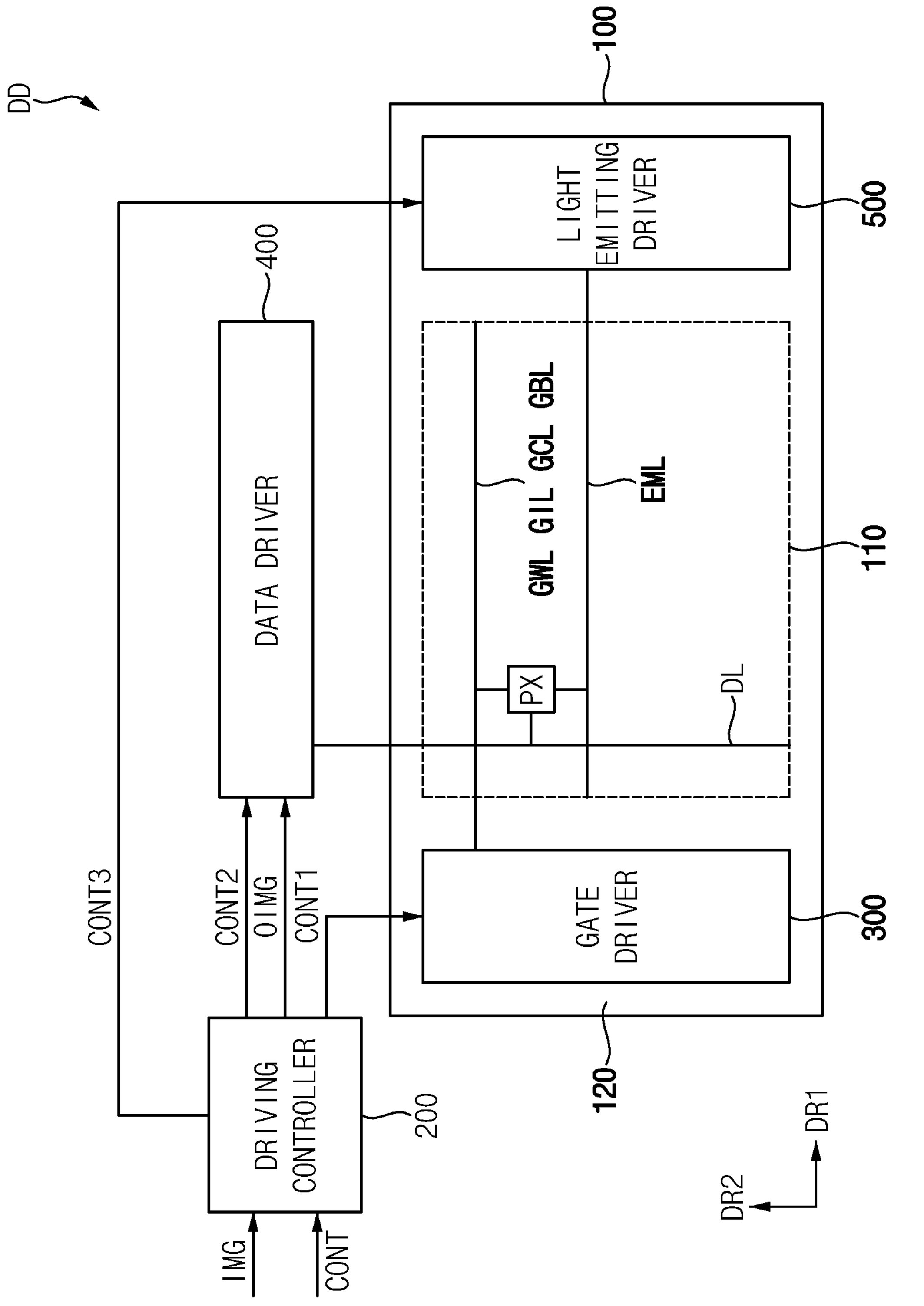
FIG. 2 is a block diagram illustrating the display device of FIG. 1.

FIG. 1 is a plan view illustrating a display device according to an embodiment of the present disclosure. FIG. 2 is a block diagram illustrating the display device of FIG. 1.

In this specification, a plane may be defined by a first direction DR1 and a second direction DR2 crossing the first direction DR1. For example, the first direction DR1 and the second direction DR2 may be perpendicular to each other.

Referring to FIG. 1, a display device DD according to an embodiment of the present disclosure may include a display area DA and a peripheral area PA. The display area DA may be defined as an area capable of displaying an image by generating light, or by adjusting transmittance of light provided from an external light source. The peripheral area PA may be defined as an area not displaying an image. In addition, the peripheral area PA may surround at least a portion of the display area DA.

A plurality of pixels PX may be disposed in the display area DA. Each of the pixels PX may emit light. Each of the pixels PX may include a first sub-pixel SPX1, a second sub-pixel SPX2, and a third sub-pixel SPX3. The first sub-pixel SPX1 may emit a first light, the second sub-pixel SPX2 may emit a second light, and the third sub-pixel SPX3 may emit a third light. For example, the first light may be red light, the second light may be green light, and the third light may be blue light.

However, the present disclosure is not limited thereto. In another embodiment, the pixels PX may emit a combination of light that includes yellow, cyan, and magenta lights.

In still another embodiment, the pixels PX may emit light of four or more colors. For example, the pixels PX may emit a combination of light that includes red, green, and blue lights, plus at least one of yellow, cyan, and magenta lights. In addition, the pixels PX may further emit white light.

Each of the first sub-pixel SPX1, the second sub-pixel SPX2, and the third sub-pixel SPX3 may be repeatedly arranged along a row direction and a column direction in a plan view. Specifically, each of the first sub-pixel SPX1, the second sub-pixel SPX2, and the third sub-pixel SPX3 may be repeatedly arranged along the first direction DR1 and the second direction DR2 in a plan view.

Referring to FIG. 2, the display device DD may include a display panel 100 and a display panel driver. The display panel 100 may include a display part 110 that displays an image and a peripheral part 120 disposed adjacent to the display part 110. In this case, the peripheral part 120 may include a gate driver 300 and a light emitting driver 500. The display panel driver may drive the display panel 100. The display panel driver may include a driving controller 200, the gate driver 300, the light emitting driver 500, and a data driver 400.

The display panel 100 may include a plurality of gate lines GWL, GIL, GCL, and GBL, a plurality of data lines DL, a plurality of light emitting control lines EML, and the pixels PX electrically connected to the gate lines GWL, GIL, GCL, and GBL, data lines DL, and the light emitting control lines EML.

The gate lines GWL, GIL, GCL, and GBL and the light emitting control lines EML may extend in the first direction DR1, and the data lines DL may extend in the second direction DR2.

The driving controller 200 may receive an input image data IMG and an input control signal CONT from a host processor (e.g., a graphic processing unit (GPU), etc.). For example, the input image data IMG may include a red image data, a green image data, and a blue image data. In an embodiment, the input image data IMG may further include a white image data. For another example, the input image data IMG may include a magenta image data, a yellow image data, and a cyan image data. The input control signal CONT may include a master clock signal and a data enable signal. The input control signal CONT may further include a vertical synchronization signal and a horizontal synchronization signal.

The driving controller 200 may generate a first control signal CONT1, a second control signal CONT2, a third control signal CONT3, and an output image data OIMG based on the input image data IMG and the input control signal CONT.

The driving controller 200 may generate the first control signal CONT1 for controlling the operation of the gate driver 300 based on the input control signal CONT. In addition, the driving controller 200 may output the first control signal CONT1 to the gate driver 300. The first control signal CONT1 may include a vertical start signal and a gate clock signal.

The driving controller 200 may generate the second control signal CONT2 for controlling the operation of the data driver 400 based on the input control signal CONT. In addition, the driving controller 200 may output the second control signal CONT2 to the data driver 400. The second control signal CONT2 may include a horizontal start signal and a load signal.

The driving controller 200 may generate the third control signal CONT3 for controlling the operation of the light emitting driver 500 based on the input control signal CONT. In addition, the driving controller 200 may output the third control signal CONT3 to the light emitting driver 500. The third control signal CONT3 may include a vertical start signal and a light emitting clock signal.

The driving controller 200 may generate the output image data OIMG by receiving the input image data IMG and the input control signal CONT. The driving controller 200 may output the output image data OIMG to the data driver 400.

The gate driver 300 may generate gate signals for driving the gate lines GWL, GIL, GCL, and GBL in response to the first control signal CONT1 received from the driving controller 200. The gate driver 300 may output the gate signals to the gate lines GWL, GIL, GCL, and GBL. The gate signals may include an initialization gate signal (e.g., an initialization gate signal GI of FIG. 3), a compensation gate signal (e.g., a compensation gate signal GC of FIG. 3), a write gate signal (e.g., a write gate signal GW of FIG. 3), and a bias gate signal (e.g., a bias gate signal GB of FIG. 3).

The gate lines GWL, GIL, GCL, and GBL may include write gate lines GWL, initialization gate lines GIL, compensation gate lines GCL, and bias gate lines GBL. For example, the gate driver 300 may output the write gate signal to the write gate lines GWL. The gate driver 300 may output the initialization gate signal to the initialization gate lines GIL. The gate driver 300 may output the compensation gate signal to the compensation gate lines GCL. The gate driver 300 may output the bias gate signal to the bias gate lines GBL.

The data driver 400 may receive the second control signal CONT2 and the output image data OIMG from the driving controller 200. The data driver 400 may generate a data voltage (e.g., a data voltage VDATA of FIG. 3) by converting the output image data OIMG into an analog form of voltage. The data driver 400 may output the data voltage to the data lines DL.

The light emitting driver 500 may receive the third control signal CONT3 from the driving controller 200. The light emitting driver 500 may generate a light emitting control signal (e.g., a light emitting control signal EM of FIG. 3) for driving the light emitting control lines EML. The light emitting driver 500 may output the light emitting control signal to the light emitting control lines EML.

FIG. 2 illustrates that the gate driver 300 is disposed on a first side of the display part 110 and the light emitting driver 500 is disposed on a second side of the display part 110 for convenience of description, but the present disclosure is not limited thereto. For example, both the gate driver 300 and the light emitting driver 500 may be disposed on the first side of the display part 110. For example, the gate driver 300 and the light emitting driver 500 may be integrally formed.

Figure 3:
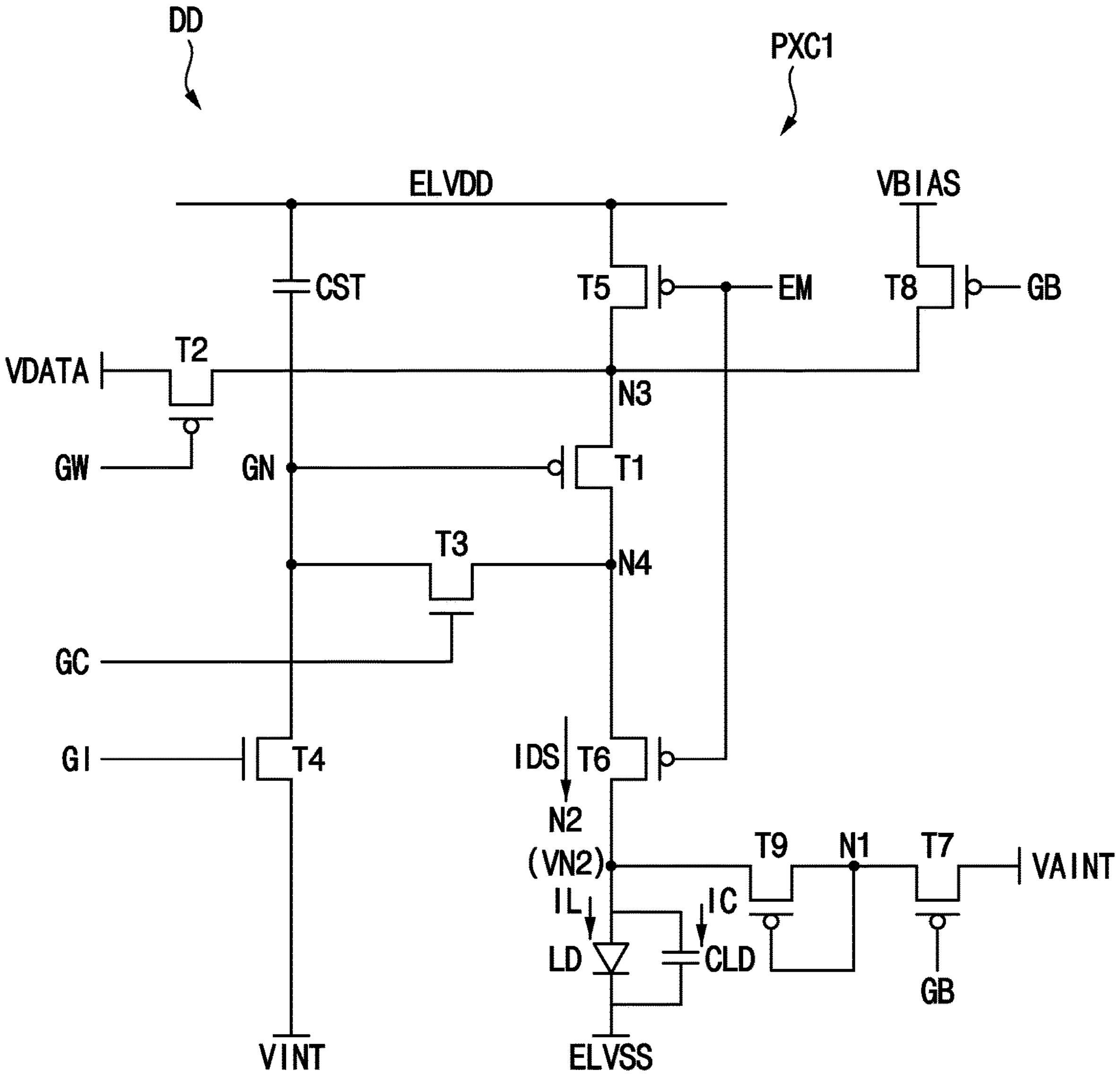
FIG. 3 is a circuit diagram illustrating an example of a sub-pixel included in the display device of FIG. 1.

FIG. 3 is a circuit diagram illustrating an example of a sub-pixel included in the display device of FIG. 1.

Referring to FIG. 3, a first pixel circuit PXC1 may include a light emitting element LD, a first transistor T1, a second transistor T2, a third transistor T3, a fourth transistor T4, a fifth transistor T5, a sixth transistor T6, a seventh transistor T7, an eighth transistor T8, a ninth transistor T9, a storage capacitor CST, and a light emitting capacitor CLD. However, the present disclosure is not limited thereto. Some of the above components of the first pixel circuit PXC1 may be omitted or other components may be added. For example, the first pixel circuit PXC1 may further include a second storage capacitor including a first electrode to which a driving voltage ELVDD is applied and a second electrode connected to a first electrode of the first transistor T1.

The first pixel circuit PXC1 may be a circuit of the first sub-pixel (e.g., the first sub-pixel SPX1 of FIG. 1), a second pixel circuit may be a circuit of the second sub-pixel (e.g., the second sub-pixel SPX2 of FIG. 1), and a third pixel circuit may be a circuit of the third sub-pixel (e.g., the third sub-pixel SPX3 of FIG. 1). The first sub-pixel may emit a first color of light, the second sub-pixel may emit a second color of light, and the third sub-pixel may emit a third color of light. For example, the second pixel circuit and the third pixel circuit may have substantially the same structure as the first pixel circuit PXC1.

The first transistor T1 may include a gate electrode, a first electrode, and a second electrode. The gate electrode of the first transistor T1 may be connected to a gate node GN. The first electrode of the first transistor T1 may be connected to a third node N3. The second electrode of the first transistor T1 may be connected to a fourth node N4. The first transistor T1 may generate a driving current IDS based on a voltage difference between the gate electrode and the first electrode. For example, the first transistor T1 may be referred to as a driving transistor.

The second transistor T2 may include a gate electrode, a first electrode, and a second electrode. The gate electrode of the second transistor T2 may receive a write gate signal GW. The second transistor T2 may be turned on or off in response to the write gate signal GW. The first electrode of the second transistor T2 may receive a data voltage VDATA. The second electrode of the second transistor T2 may be connected to the third node N3. While the second transistor T2 is turned on, the second transistor T2 may provide the data voltage VDATA to the first electrode of the first transistor T1. For example, the second transistor T2 may be referred to as a writing transistor.

The third transistor T3 may include a gate electrode, a first electrode, and a second electrode. The third transistor T3 may be connected between the gate electrode of the first transistor T1 and the second electrode of the first transistor T1. In other words, the first electrode of the third transistor T3 may be connected to the gate node GN, and the second electrode of the third transistor T3 may be connected to the fourth node N4. The gate electrode of the third transistor T3 may receive a compensation gate signal GC. The third transistor T3 may be turned on or off in response to the compensation gate signal GC. While the third transistor T3 is turned on, the third transistor T3 may diode-connect the first transistor T1. In other words, the third transistor T3 may compensate for the threshold voltage of the first transistor T1. For example, the third transistor T3 may be referred to as a compensation transistor. In an embodiment, the third transistor T3 may be a NMOS transistor. However, the present disclosure is not limited thereto.

As illustrated in FIG. 3, the third transistor T3 may have a single transistor structure. Alternatively, the third transistor T3 may have a dual transistor structure in which two transistors are connected in series.

The fourth transistor T4 may include a gate electrode, a first electrode, and a second electrode. The gate electrode of the fourth transistor T4 may receive an initialization gate signal GI. The fourth transistor T4 may be turned on or off in response to the initialization gate signal GI. The first electrode of the fourth transistor T4 may receive a gate initialization voltage VINT. The second electrode of the fourth transistor T4 may be connected to the gate node GN. While the fourth transistor T4 is turned on, the fourth transistor T4 may provide the gate initialization voltage VINT to the gate electrode of the first transistor T1. For example, the fourth transistor T4 may be referred to as a gate initialization transistor. In an embodiment, the fourth transistor T4 may be a NMOS transistor. However, the present disclosure is not limited thereto.

As illustrated in FIG. 3, the fourth transistor T4 may have a single transistor structure. Alternatively, the fourth transistor T4 may have a dual transistor structure in which two transistors are connected in series.

The fifth transistor T5 may include a gate electrode, a first electrode and a second electrode. The gate electrode of the fifth transistor T5 may receive a light emitting control signal EM. The fifth transistor T5 may be turned on or off in response to the light emitting control signal EM. The first electrode of the fifth transistor T5 may receive the driving voltage ELVDD. The second electrode of the fifth transistor T5 may be connected to the third node N3. While the fifth transistor T5 is turned on, the fifth transistor T5 may provide the driving voltage ELVDD to the first electrode of the first transistor T1. For example, the fifth transistor T5 may be referred to as a first light emitting control transistor.

The sixth transistor T6 may include a gate electrode, a first electrode, and a second electrode. The gate electrode of the sixth transistor T6 may receive the light emitting control signal EM. The sixth transistor T6 may be turned on or off in response to the light emitting control signal EM. The first electrode of the sixth transistor T6 may be connected to the fourth node N4. The second electrode of the sixth transistor T6 may be connected to a second node N2. While the sixth transistor T6 is turned on, the sixth transistor T6 may provide the driving current IDS generated by the first transistor T1 to the light emitting element LD. For example, the sixth transistor T6 may be referred to as a second light emitting control transistor.

The seventh transistor T7 may include a gate electrode, a first electrode, and a second electrode. The gate electrode of the seventh transistor T7 may receive a bias gate signal GB. The seventh transistor T7 may be turned on or off in response to the bias gate signal GB. The first electrode of the seventh transistor T7 may receive an anode initialization voltage VAINT. The second electrode of the seventh transistor T7 may be connected to a first node N1. While the seventh transistor T7 is turned on, the seventh transistor T7 may provide the anode initialization voltage VAINT to the first node N1. For example, the seventh transistor T7 may be referred to as an anode initialization transistor.

The eighth transistor T8 may include a gate electrode, a first electrode, and a second electrode. The gate electrode of the eighth transistor T8 may receive the bias gate signal GB. The eighth transistor T8 may be turned on or off in response to the bias gate signal GB. The first electrode of the eighth transistor T8 may receive a bias voltage VBIAS. The second electrode of the eighth transistor T8 may be connected to the third node N3. While the eighth transistor T8 is turned on, the eighth transistor T8 may provide the bias voltage VBIAS to the first electrode of the first transistor T1. For example, the eighth transistor T8 may be referred to as an initialization transistor.

The ninth transistor T9 may include a gate electrode, a first electrode, and a second electrode. The gate electrode of the ninth transistor T9 may be connected to the first node N1. The first electrode of the ninth transistor T9 may be connected to the first node N1. In other words, the ninth transistor T9 may be diode-connected. The second electrode of the ninth transistor T9 may be connected to the second node N2. For example, the ninth transistor T9 may be referred to as a temperature compensation transistor.

The storage capacitor CST may include a first electrode and a second electrode. The first electrode of the storage capacitor CST may receive the driving voltage ELVDD. The second electrode of the storage capacitor CST may be connected to the gate node GN. The storage capacitor CST may maintain the voltage level of the gate electrode of the first transistor T1 when the second transistor T2 is turned off.

The light emitting element LD may include an anode electrode and a cathode electrode. The anode electrode of the light emitting element LD may be connected to the second node N2. The cathode electrode of the light emitting element LD may receive a common voltage ELVSS. The light emitting element LD may generate light having a luminance corresponding to a current TL flowing into the light emitting element LD.

The light emitting capacitor CLD may include a first electrode and a second electrode. The first electrode of the light emitting capacitor CLD may be connected to the second node N2. The second electrode of the light emitting capacitor CLD may receive the common voltage ELVSS.

As a display device is driven, a temperature difference between sub-pixels may occur. When the temperature relatively increases, a driving range (DR) of the first transistor T1 may relatively increase. Accordingly, the driving current IDS generated by the first transistor T1 may increase. In this case, a luminance difference between the sub-pixels may occur.

To prevent this, the first pixel circuit PXC1 of the present disclosure may include the ninth transistor T9 connected to the second electrode of the seventh transistor T7. Specifically, the first electrode and the gate electrode of the ninth transistor T9 may be connected to the seventh transistor T7 through the first node N1. In other words, the ninth transistor T9 may be diode-connected.

When a voltage of the second node N2 is defined as VN2, the voltage VN2 of the second node N2 satisfies Equation 1 below.

$$VN2 = VAINT + |Vth|_{T9} \ldots \qquad \text{[Equation 1]}$$

Since the ninth transistor T9 is diode-connected, a value obtained by subtracting an absolute value of the threshold voltage of the ninth transistor T9 ($|Vth|_{T9}$) from the voltage VN2 of the second node N2 may be the anode initialization voltage VAINT. In other words, the voltage VN2 of the second node N2 may have a value obtained by adding the absolute value of the threshold voltage of the ninth transistor T9 ($|Vth|_{T9}$) to the anode initialization voltage VAINT.

For example, when the anode initialization voltage VAINT is about −7 V and the threshold voltage of the ninth transistor T9 ($(Vth)_{T9}$) is about −2.5 V, the voltage VN2 of the 10 second node N2 may be about −4.5 V. In other words, the voltage VN2 of the second node N2 may be greater than the anode initialization voltage VAINT.

In an embodiment, the ninth transistor T9 may be a PMOS transistor. When the ninth transistor T9 is a PMOS transistor, the threshold voltage of the ninth transistor T9 ($(Vth)_{T9}$) may increase when the temperature increases. In other words, when the temperature increases, the threshold voltage of the ninth transistor T9 ($(Vth)_{T9}$) may shift in a positive direction.

A threshold voltage of the ninth transistor T9 when driven at a first temperature may be defined as $(Vth1)_{T9}$, and a threshold voltage of the ninth transistor T9 when driven at a second temperature greater than the first temperature may be defined as $(Vth2)_{T9}$. For example, when driving at the first temperature, the threshold voltage of the ninth transistor T9 $(Vth1)_{T9}$ may be about −2.5 V, and when driving at the second temperature, the threshold voltage of the ninth transistor T9 $(Vth2)_{T9}$ may be about −2.0 V In this case, when driving at the first temperature, the voltage VN2 of the second node N2 may be about −4.5 V, and when driving at the second temperature, the voltage VN2 of the second node N2 may be about −5.0 V. That is, the voltage VN2 of the second node N2 when driving at the first temperature may be greater than the voltage VN2 of the second node N2 when driving at the second temperature greater than the first temperature.

As the voltage VN2 of the second node N2 relatively decreases when driving at the second temperature greater than the first temperature, a voltage applied to the light emitting element LD and the light emitting capacitor CLD may decrease. As the voltage applied to the light emitting capacitor CLD decreases, the amount of a current IC flowing in the light emitting capacitor CLD may increase.

The driving current IDS generated by the first transistor T1 may be expressed as the sum of the current IL flowing into the light emitting element LD and the current IC flowing into the light emitting capacitor CLD. When the driving temperature of the display device DD increases, the driving current IDS generated by the first transistor T1 may increase as the driving range of the first transistor T1 increases. According to the present disclosure, when the driving temperature of the display device DD increases, the amount of the current IC flowing into the light emitting capacitor CLD may increase, so that the increase in the current IL flowing into the light emitting element LD may be reduced. Accordingly, a problem in which the luminance difference between the sub-pixels occurs depending on temperature may be improved.

Figure 4:
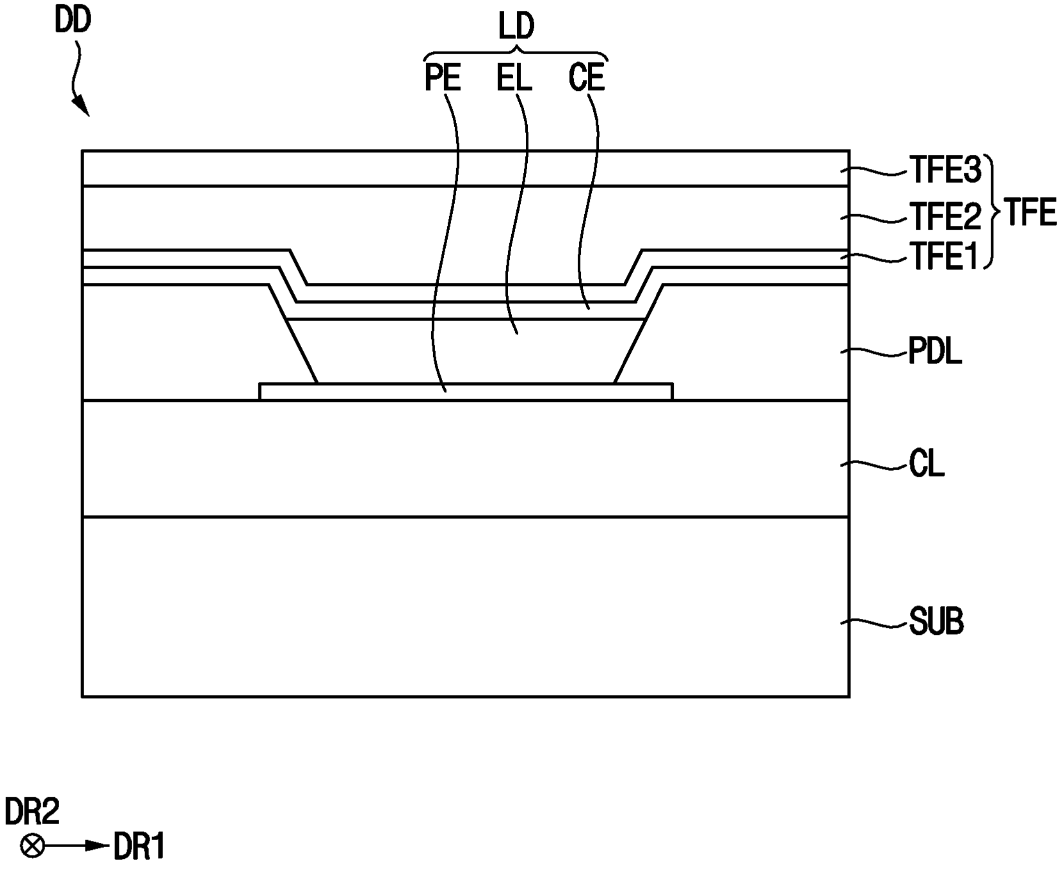
FIG. 4 is a cross-sectional view illustrating the display device of FIG. 1.

FIG. 4 is a cross-sectional view illustrating the display device of FIG. 1. For example, FIG. 4 is a cross-sectional view illustrating an example of a cross-section of a sub-pixel of FIG. 1.

Referring to FIG. 4, the display device DD according to an embodiment of the present disclosure may include a substrate SUB, a circuit layer CL, the light emitting element LD, a pixel defining layer PDL, and an encapsulation layer TFE. The light emitting element LD may include an anode electrode PE, a light emitting layer EL, and a cathode electrode CE.

The substrate SUB may include a transparent material or an opaque material. The substrate SUB may be formed of a transparent resin substrate. Examples of the transparent resin substrate may include a polyimide substrate, etc. In this case, the polyimide substrate may include a first organic layer, a first barrier layer, a second organic layer, etc. Alternatively, the substrate SUB may include a quartz substrate, a synthetic quartz substrate, a calcium fluoride substrate, a fluorine-doped quartz substrate, a soda-lime glass substrate, a non-alkali glass substrate, etc. These may be used alone or in combination with each other.

The circuit layer CL may be disposed on the substrate SUB. The circuit layer CL may provide signals and voltages to the light emitting element LD for the light emitting element LD to emit light. For example, the circuit layer CL may include transistors, a conductive layer, an insulating layer, etc.

The anode electrode PE may be disposed on the circuit layer CL. The anode electrode PE may receive the signals and the voltages from the circuit layer CL. For example, the anode electrode PE may include a metal, an alloy, a metal nitride, a conductive metal oxide, a transparent conductive material, etc. These may be used alone or in combination with each other.

The pixel defining layer PDL may be disposed on the circuit layer CL and the anode electrode PE. An opening exposing at least a part of an upper surface of the anode electrode PE may be defined in the pixel defining layer PDL. As the opening is defined in the pixel defining layer PDL, the pixel defining layer PDL may define sub-pixels (e.g., the first sub-pixel SPX1, the second sub-pixel SPX2, and the third sub-pixel SPX3 of FIG. 1) that emit light. The pixel defining layer PDL may include an organic insulating material or an inorganic insulating material. The organic insulating material may include photoresist, polyacryl-based resin, polyimide-based resin, acryl-based resin, etc. These may be used alone or in combination with each other.

The light emitting layer EL may be disposed on the anode electrode PE. Specifically, the light emitting layer EL may be disposed in the opening of the pixel defining layer PDL. The light emitting layer EL may include materials for emitting light. For example, the light emitting layer EL may include an organic light emitting material and/or an inorganic light emitting material.

The cathode electrode CE may be disposed on the pixel defining layer PDL and the light emitting layer EL. For example, the cathode electrode CE may include a metal, an alloy, a metal nitride, a conductive metal oxide, a transparent conductive material, etc. These may be used alone or in combination with each other.

Accordingly, the light emitting element LD including the anode electrode PE, the light emitting layer EL, and the cathode electrode CE may be disposed on the substrate SUB.

The encapsulation layer TFE may be disposed on the cathode electrode CE. The encapsulation layer TFE may protect the light emitting element LD from external oxygen and moisture. The encapsulation layer TFE may include at least one inorganic layer and at least one organic layer. For example, the encapsulation layer TFE may include a first inorganic layer TFE1 disposed on the cathode electrode CE, an organic layer TFE2 disposed on the first inorganic layer TFE1, and a second inorganic layer TFE3 disposed on the organic layer TFE2.

Although the display device DD of the present disclosure is described as the organic light emitting display device ("OLED"), the configuration of the present disclosure is not limited thereto. In other embodiments, the display device DD may include a liquid crystal display device ("LCD"), a field emission display device ("FED"), a plasma display device ("PDP"), an electrophoretic image display device ("EPD"), an inorganic light emitting display device ("ILED"), or a quantum dot display device.

FIGS. 5, 6, 7, 8, 9, 10, 11, 12, 13, 14, 15, 16, 17, 18, and 19 are layout diagrams for describing a sub-pixel included in the display device of FIGS. 1 and 3. For example, FIG. 19 may be an example of a layout diagram illustrating the circuit layer CL of FIG. 4. Although the components illustrated in FIGS. 5 to 19 are illustrated based on one first pixel circuit PXC1, the components illustrated in FIGS. 5 to 19 may be equally disposed in each pixel circuit. At least some of the components illustrated in FIGS. 5 to 19 may be connected to each other among a plurality of pixel circuits.

Figure 5:
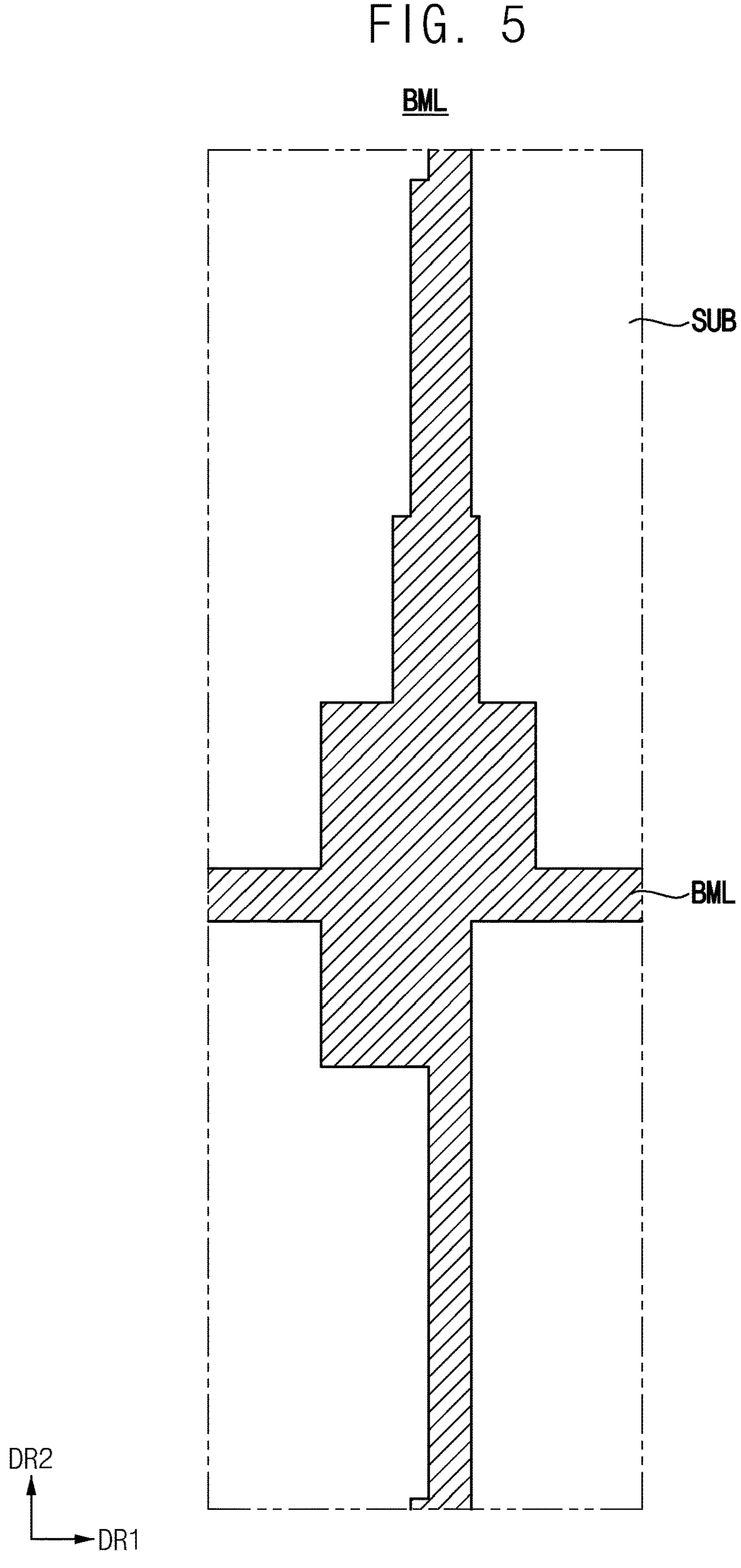
FIGS. 5, 6, 7, 8, 9, 10, 11, 12, 13, 14, 15, 16, 17, 18, and 19 are layout diagrams for describing a sub-pixel included in the display device of FIGS. 1 and 3.

Referring to FIG. 5, the display device DD according to an embodiment of the present disclosure may include the substrate SUB and a lower pattern BML.

The lower pattern BML may be disposed on the substrate SUB. The lower pattern BML may include a metal, an alloy, a conductive metal oxide, a transparent conductive material, etc. Examples of the material that may be used as the lower pattern BML may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. These may be used alone or in combination with each other.

In an embodiment, a constant voltage may be provided to the lower pattern BML. For example, the driving voltage (e.g., the driving voltage ELVDD of FIG. 3) may be provided to the lower pattern BML. However, the present disclosure is not limited thereto, and the lower pattern BML may be electrically floating.

Figure 6:
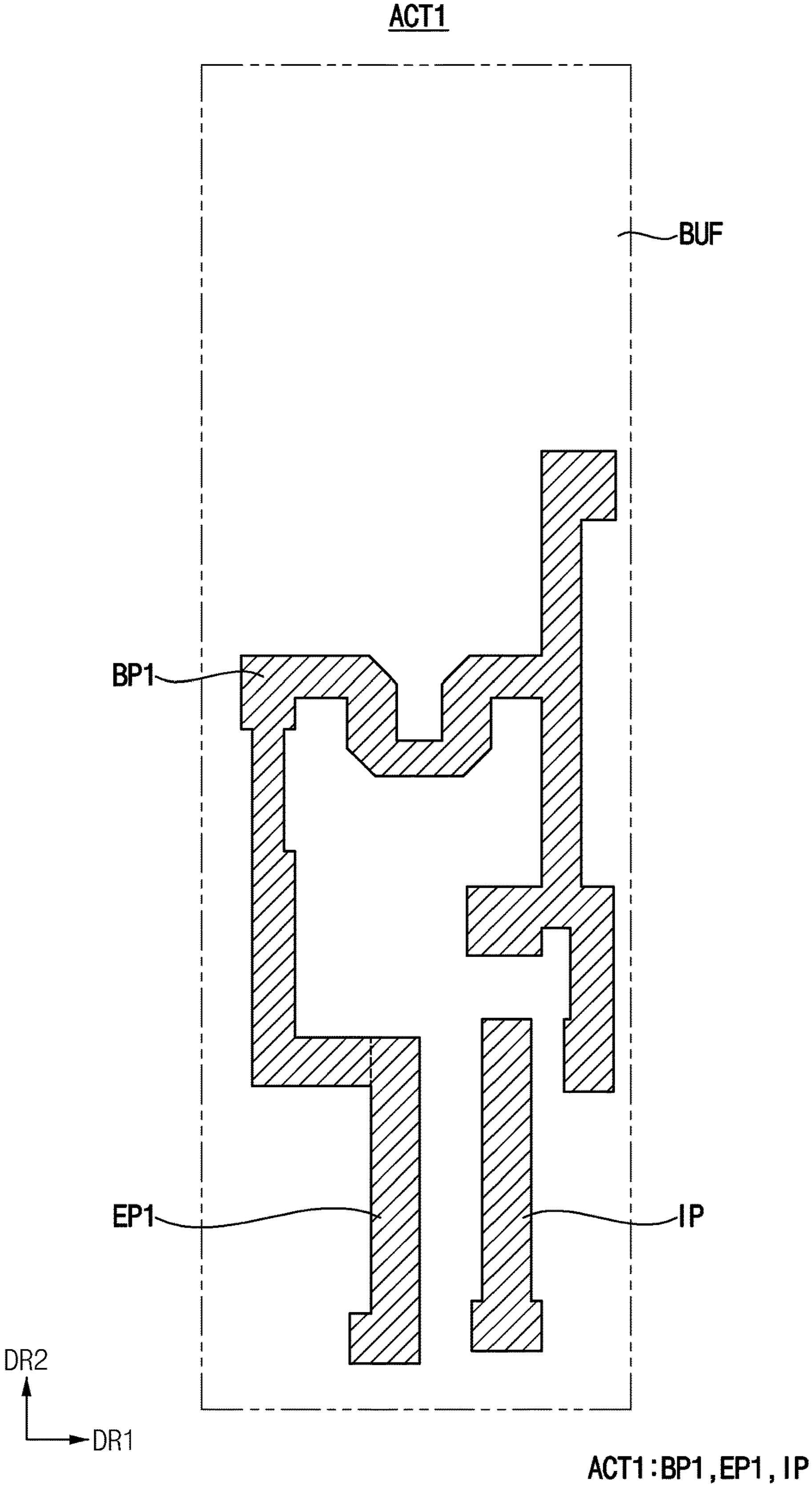
Figure 7:
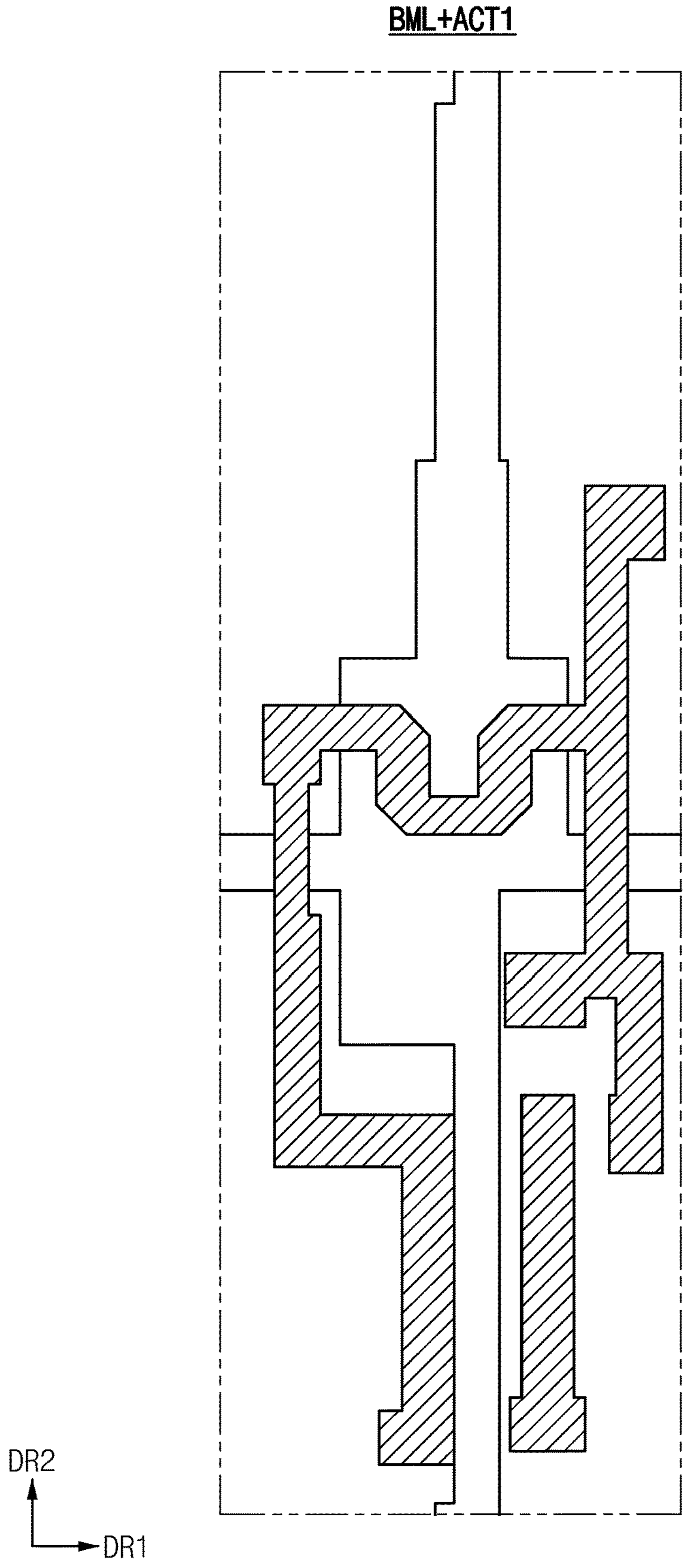

Referring further to FIGS. 6 and 7, a buffer layer BUF may be disposed on the lower pattern BML and may cover the lower pattern BML.

The buffer layer BUF may prevent metal atoms or impurities from diffusing into a first active pattern ACT1. In addition, the buffer layer BUF may control a thermal conductivity of the first active pattern ACT1 during a crystallization process for forming the first active pattern ACT1. The buffer layer BUF may include an inorganic insulating material. Examples of the inorganic insulating material that may be used as the buffer layer BUF may include silicon oxide, silicon nitride, silicon oxynitride, etc. These may be used alone or in combination with each other.

The first active pattern ACT1 may be disposed on the buffer layer BUF. At least a part of the first active pattern ACT1 may overlap the lower pattern BML in a plan view.

The first active pattern ACT1 may include a first body portion BP1, a first extension portion EP1, and an independent portion IP. The first body portion BP1, the first extension portion EP1, and the independent portion IP may be disposed on the same layer and may include the same material. For example, the first extension portion EP1 may be connected to the first body portion BP1 and may be disposed adjacent to the first body portion BP1 in the first direction DR1. The independent portion IP may be spaced apart from each of the first body portion BP1 and the first extension portion EP1. For example, the independent portion IP may be spaced apart from the first extension portion EP1 in the first direction DR1.

In an embodiment, the first active pattern ACT1 may include a silicon semiconductor material. Examples of the silicon semiconductor material that may be used as the first active pattern ACT1 may include amorphous silicon, polycrystalline silicon, etc. The first active pattern ACT1 may include a source area, a drain area, and a channel area positioned between the source area and the drain area.

Figure 8:
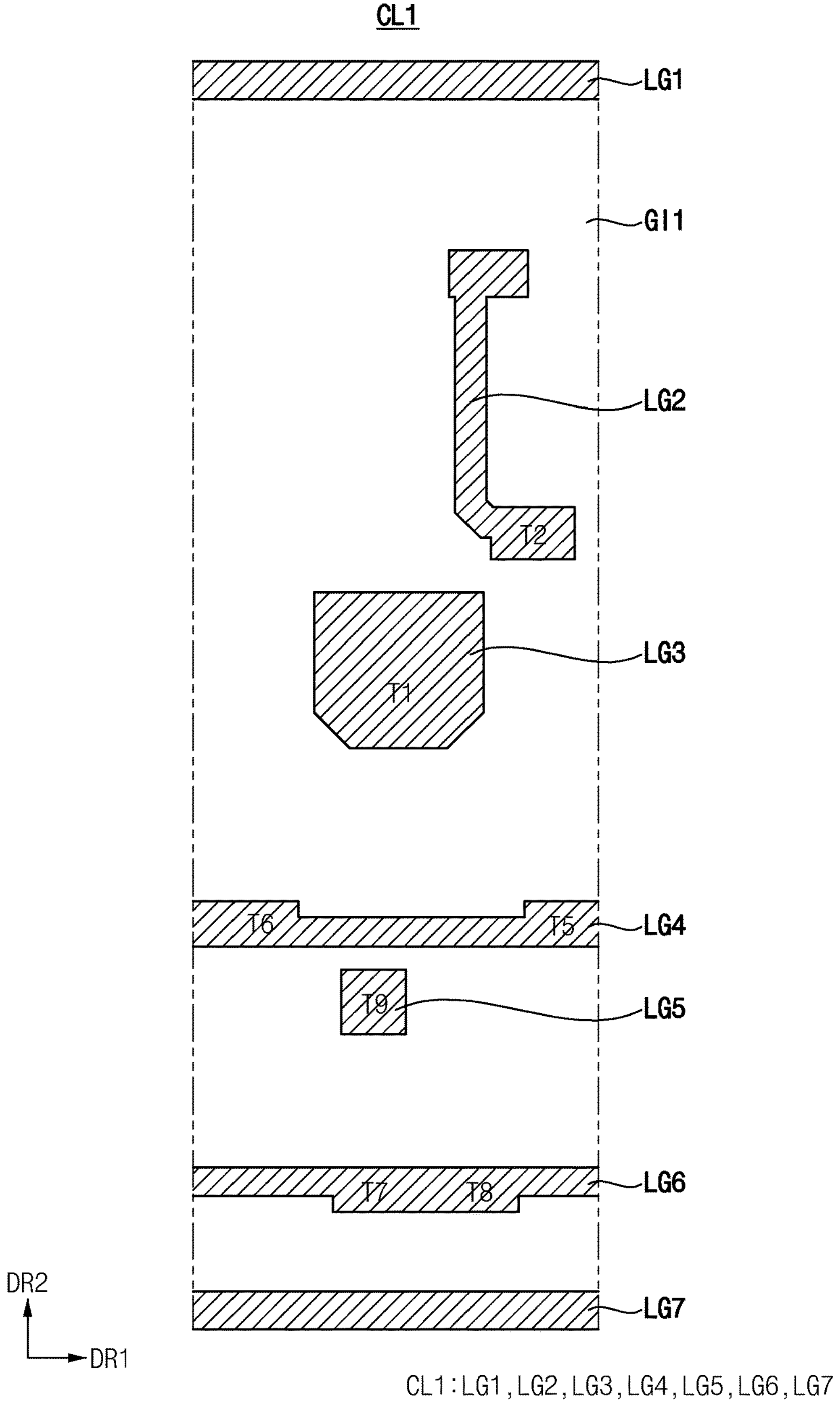
Figure 9:
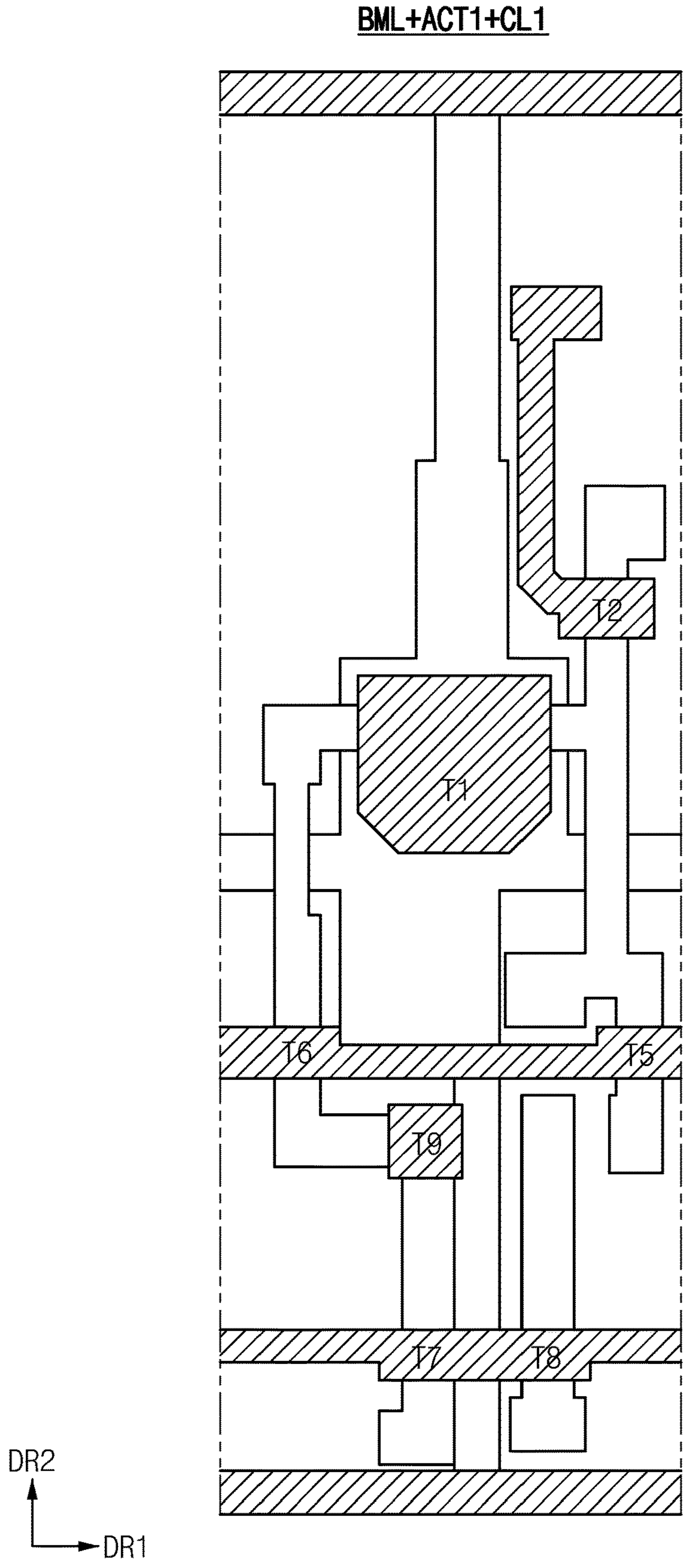

Referring further to FIGS. 8 and 9, a first gate insulating layer GI1 may be disposed on the first active pattern ACT1 and may cover the first active pattern ACT1.

The first gate insulating layer GI1 may include an inorganic insulating material. Examples of the inorganic insulating material that may be used as the first gate insulating layer GI1 may include silicon oxide, silicon nitride, silicon oxynitride, etc. These may be used alone or in combination with each other.

A first conductive layer CL1 may be disposed on the first gate insulating layer GI1. The first conductive layer CL1 may include a first lower gate pattern LG1, a second lower gate pattern LG2, a third lower gate pattern LG3, a fourth lower gate pattern LG4, a fifth lower gate pattern LG5, a sixth lower gate pattern LG6, and a seventh lower gate pattern LG7. The first to seventh lower gate patterns LG1, LG2, LG3, LG4, LG5, LG6, and LG7 may be disposed on the same layer and may include the same material. The first conductive layer CL1 may include a metal, an alloy, a metal nitride, a conductive metal oxide, a transparent conductive material, etc. These may be used alone or in combination with each other.

The first conductive layer CL1 may at least partially overlap the first active pattern ACT1. An overlapping portion between the first conductive layer CL1 and the first active pattern ACT1 may configure a part of a transistor.

The first lower gate pattern LG1 may extend in the first direction DR1. The bias voltage (e.g., the bias voltage VBIAS of FIG. 3) may be provided to the first lower gate pattern LG1. The first lower gate pattern LG1 may be referred to as a first bias voltage line.

The second lower gate pattern LG2 may be spaced apart from the first lower gate pattern LG1 in the second direction DR2. A part of the first body portion BP1 and a part of the second lower gate pattern LG2 overlapping the first body portion BP1 may configure the second transistor T2. For example, the second lower gate pattern LG2 may correspond to the gate electrode of the second transistor T2. The write gate signal (e.g., the write gate signal GW of FIG. 3) may be provided to the second lower gate pattern LG2.

The third lower gate pattern LG3 may be spaced apart from the second lower gate pattern LG2 in the second direction DR2. The third lower gate pattern LG3 may have an island shape in a plan view. A part of the first body portion BP1 and a part of the third lower gate pattern LG3 overlapping the first body portion BP1 may configure the first transistor T1. For example, the third lower gate pattern LG3 may correspond to the gate electrode of the first transistor T1.

The fourth lower gate pattern LG4 may extend in the first direction DR1 and may be spaced apart from the third lower gate pattern LG3 in the second direction DR2. A part of the first body portion BP1 and a first part of the fourth lower gate pattern LG4 overlapping the first body portion BP1 may configure the fifth transistor T5. A part of the first body portion BP1 and a second part of the fourth lower gate pattern LG4 overlapping the first body portion BP1 may configure the sixth transistor T6. For example, the fourth lower gate pattern LG4 may correspond to the gate electrode of the fifth transistor T5 and the gate electrode of the sixth transistor T6. The light emitting control signal (e.g., the light emitting control signal EM of FIG. 3) may be provided to the fourth lower gate pattern LG4.

The fifth lower gate pattern LG5 may be spaced apart from the fourth lower gate pattern LG4 in the second direction DR2 and may have an island shape in a plan view. A part of the first extension portion EP1 and a part of the fifth lower gate pattern LG5 overlapping the first extension portion EP1 may configure the ninth transistor T9. For example, the fifth lower gate pattern LG5 may correspond to the gate electrode of the ninth transistor T9.

The sixth lower gate pattern LG6 may extend in the first direction DR1 and may be spaced apart from the fifth lower gate pattern LG5 in the second direction DR2. A part of the first extension portion EP1 and a part of the sixth lower gate pattern LG6 overlapping the first extension portion EP1 may configure the seventh transistor T7. A part of the independent portion IP and a part of the sixth lower gate pattern LG6 overlapping the independent portion IP may configure the eighth transistor T8. For example, the sixth lower gate pattern LG6 may correspond to the gate electrode of the seventh transistor T7 and the gate electrode of the eighth transistor T8. The bias gate signal (e.g., the bias gate signal GB of FIG. 3) may be provided to the sixth lower gate pattern LG6.

The seventh lower gate pattern LG7 may extend in the first direction DR1 and may be spaced apart from the sixth lower gate pattern LG6 in the second direction DR2. The anode initialization voltage (e.g., the anode initialization voltage VAINT of FIG. 3) may be provided to the seventh lower gate pattern LG7. The seven lower gate pattern LG7 may be referred to as a first anode initialization voltage line.

Figure 10:
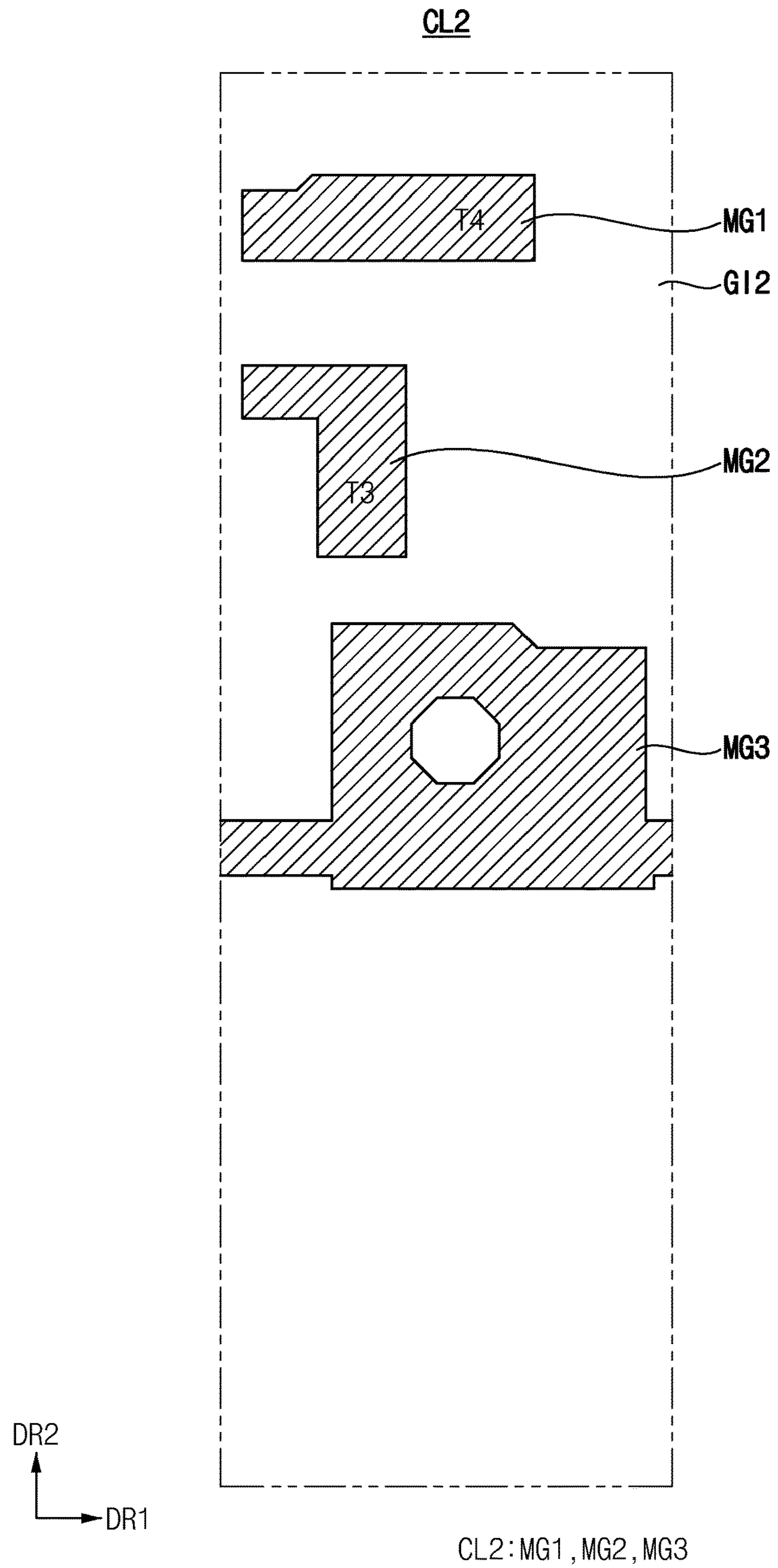
Figure 11:
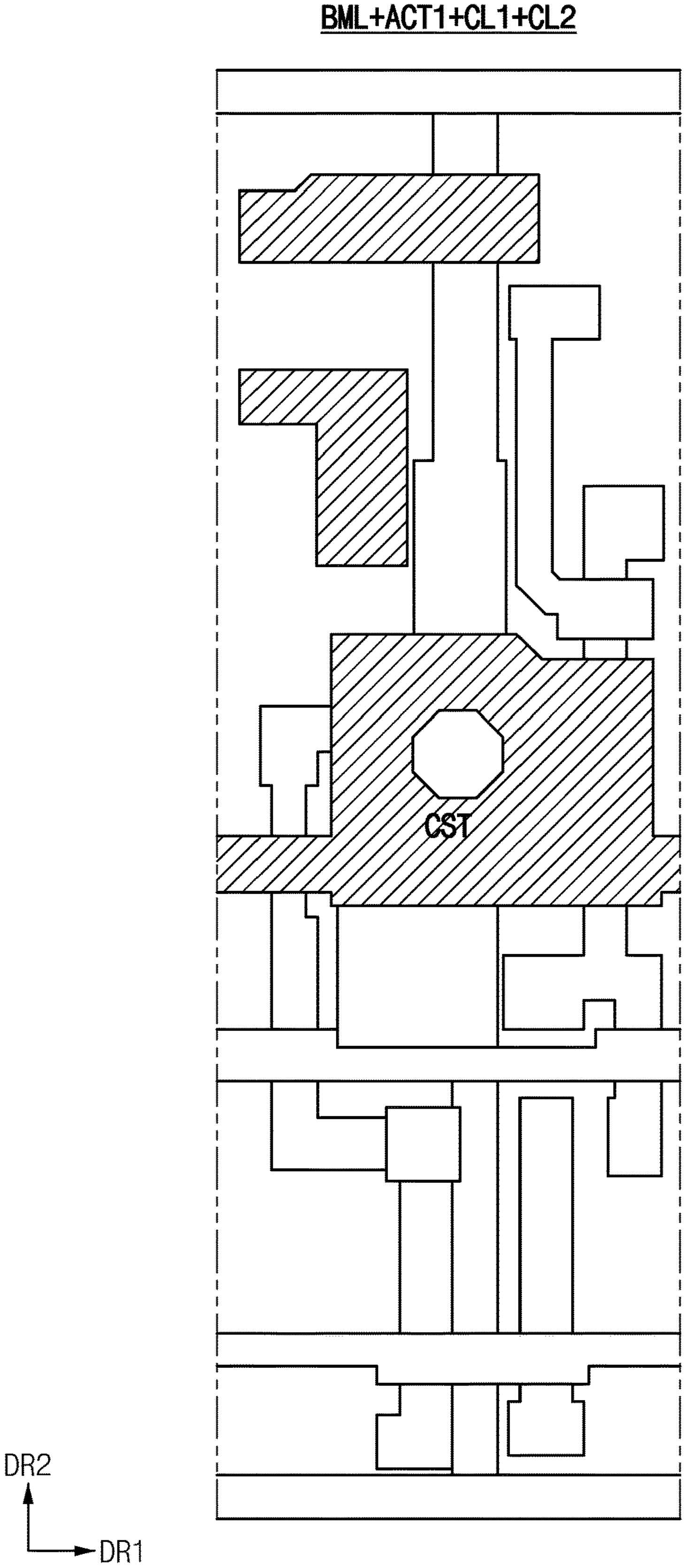

Referring further to FIGS. 10 and 11, a second gate insulating layer GI2 may be disposed on the first conductive layer CL1 and may cover the first conductive layer CL1.

The second gate insulating layer GI2 may include an inorganic insulating material. Examples of the inorganic insulating material that may be used as the second gate insulating layer GI2 may include silicon oxide, silicon nitride, silicon oxynitride, etc. These may be used alone or in combination with each other.

A second conductive layer CL2 may be disposed on the second gate insulating layer GI2. The second conductive layer CL2 may include a first intermediate gate pattern MG1, a second intermediate gate pattern MG2, and a third intermediate gate pattern MG3. The first to third intermediate gate patterns MG1, MG2, and MG3 may be disposed on the same layer and may include the same material. The second conductive layer CL2 may include a metal, an alloy, a metal nitride, a conductive metal oxide, a transparent conductive material, etc. These may be used alone or in combination with each other.

The first intermediate gate pattern MG1 may configure the fourth transistor T4. The initialization gate signal (e.g., the initialization gate signal GI of FIG. 3) may be provided to the first intermediate gate pattern MG1.

The second intermediate gate pattern MG2 may be spaced apart from the first intermediate gate pattern MG1 in the second direction DR2. The second intermediate gate pattern MG2 may configure the third transistor T3. The compensation gate signal (e.g., the compensation gate signal GC of FIG. 3) may be provided to the second intermediate gate pattern MG2.

The third intermediate gate pattern MG3 may be spaced apart from the second intermediate gate pattern MG2 in the second direction DR2. The third intermediate gate pattern MG3 may overlap the third lower gate pattern LG3 in a plan view. The third intermediate gate pattern MG3 and the third lower gate pattern LG3 may form the storage capacitor CST in an area where the third intermediate gate pattern MG3 and the third lower gate pattern LG3 overlap. In an embodiment, an opening exposing an upper surface of the third lower gate pattern LG3 may be defined in the third intermediate gate pattern MG3.

Figure 12:
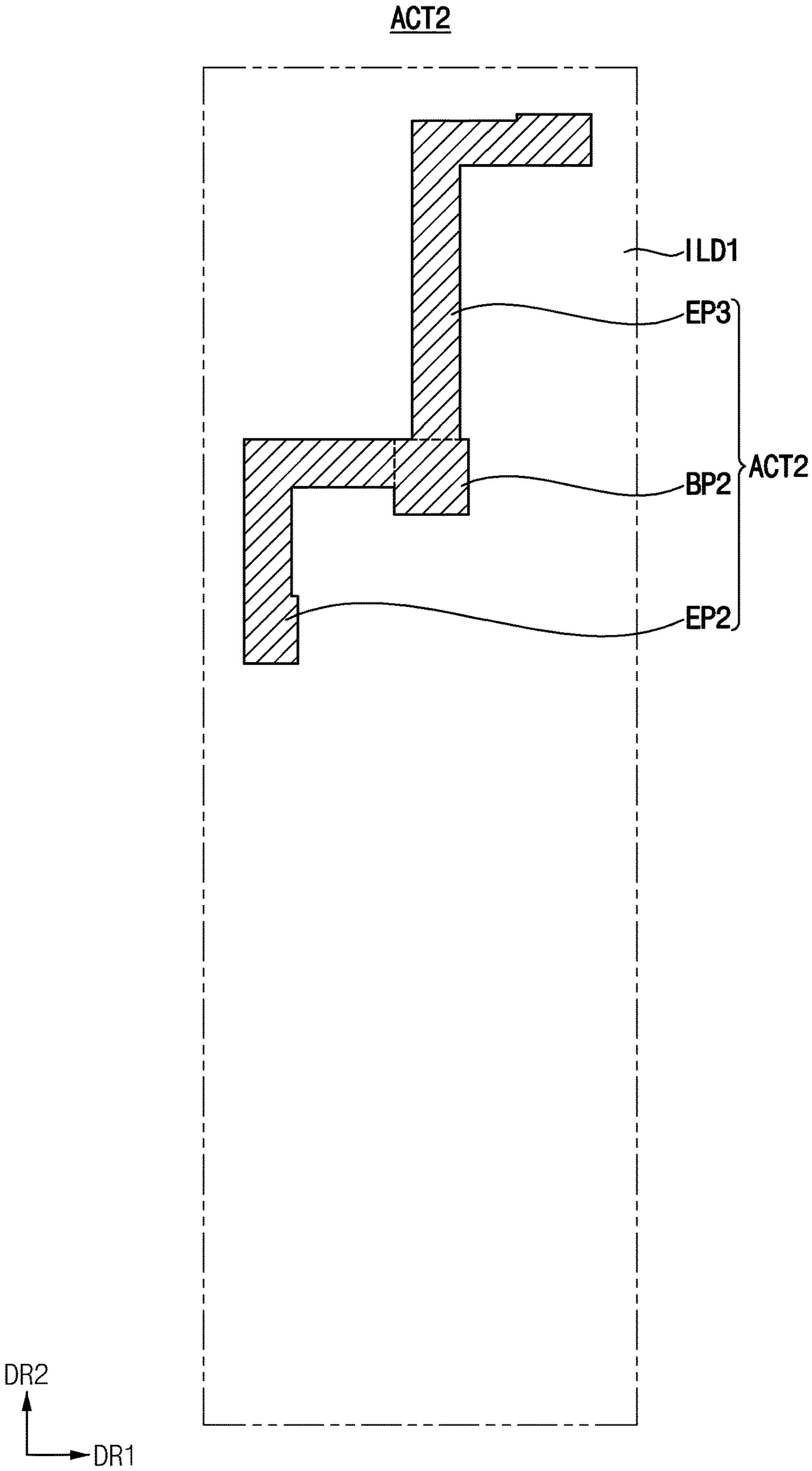
Figure 13:
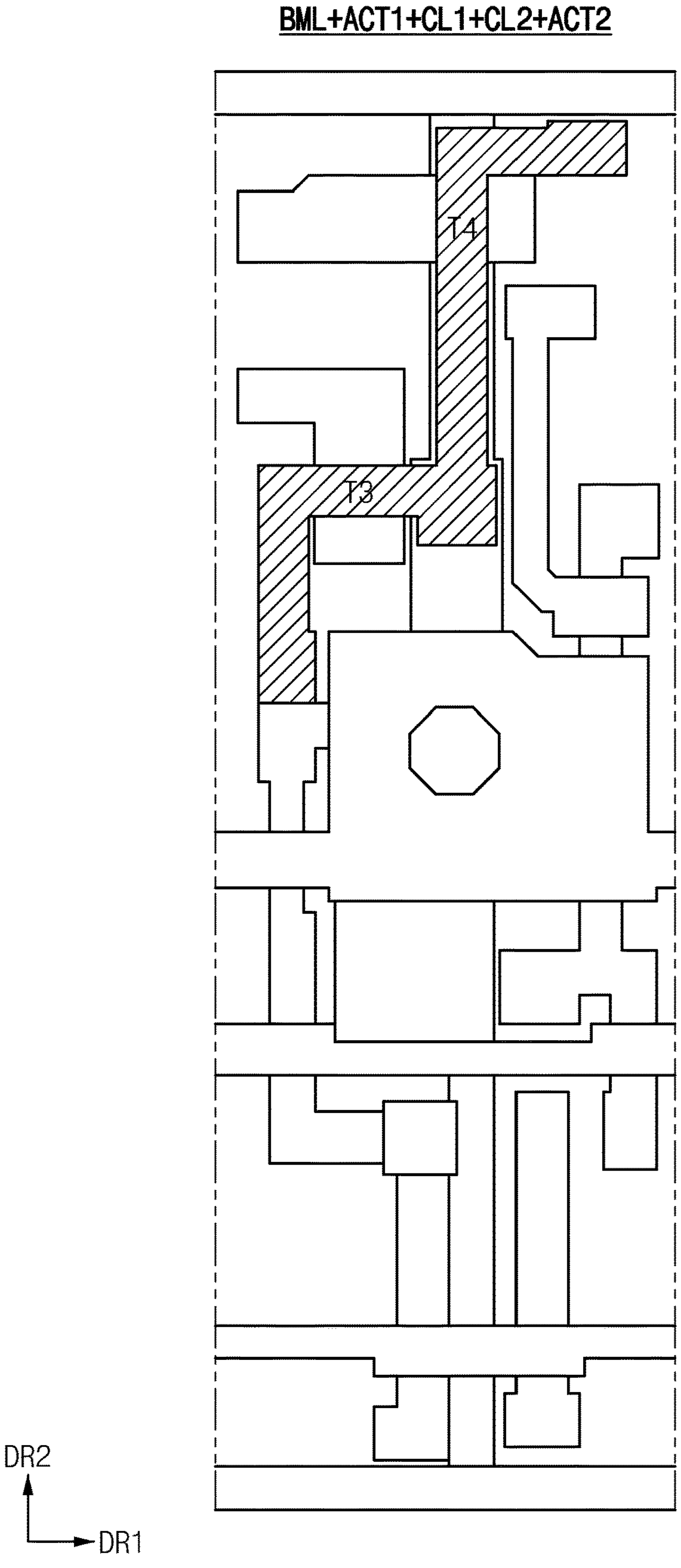

Referring further to FIGS. 12 and 13, a first inter-layer insulating layer ILD1 may be disposed on the second conductive layer CL2 and may cover the second conductive layer CL2.

The first inter-layer insulating layer ILD1 may include an inorganic insulating material. Examples of the inorganic insulating material that may be used as the first inter-layer insulating layer ILD1 may include silicon oxide, silicon nitride, silicon oxynitride, etc. These may be used alone or in combination with each other.

A second active pattern ACT2 may be disposed on the first inter-layer insulating layer ILD1. At least a part of the second active pattern ACT2 may overlap each of the first intermediate gate pattern MG1 and the second intermediate gate pattern MG2 in a plan view.

The second active pattern ACT2 may include a second body portion BP2, a second extension portion EP2, and a third extension portion EP3. The second body portion BP2, the second extension portion EP2 and the third extension portion EP3 may be disposed on the same layer and include the same material. For example, the second extension portion EP2 may be connected to the second body portion BP2 and may be disposed adjacent to the second body portion BP2 in the first direction DR1. The third extension portion EP3 may be connected to the second body portion BP2 and may be disposed adjacent to the second body portion BP2 in the second direction DR2. The second extension portion EP2 and the third extension portion EP3 may be spaced apart from each other.

A part of the second extension portion EP2 and a part of the second intermediate gate pattern MG2 overlapping the second extension portion EP2 may configure the third transistor T3. For example, the second intermediate gate pattern MG2 may correspond to a lower gate electrode of the third transistor T3.

Apart of the third extension portion EP3 and apart of the first intermediate gate pattern MG1 overlapping the third extension portion EP3 may configure the fourth transistor T4. For example, the first intermediate gate pattern MG1 may correspond to a lower gate electrode of the fourth transistor T4.

In an embodiment, the second active pattern ACT2 may be disposed on a different layer from the first active pattern ACT1 and may not overlap the first active pattern ACT1. In other words, the second active pattern ACT2 may be formed separately from the first active pattern ACT1.

In an embodiment, the first active pattern ACT1 and the second active pattern ACT2 may include different materials. For example, the first active pattern ACT1 may include a silicon semiconductor material, and the second active pattern ACT2 may include an oxide semiconductor material. Examples of the oxide semiconductor material that may be used as the second active pattern ACT2 may include indium gallium zinc oxide (IGZO), indium tin zinc oxide (ITZO), etc. The second active pattern ACT2 may include a source area, a drain area, and a channel area positioned between the source area and the drain area.

Figure 14:
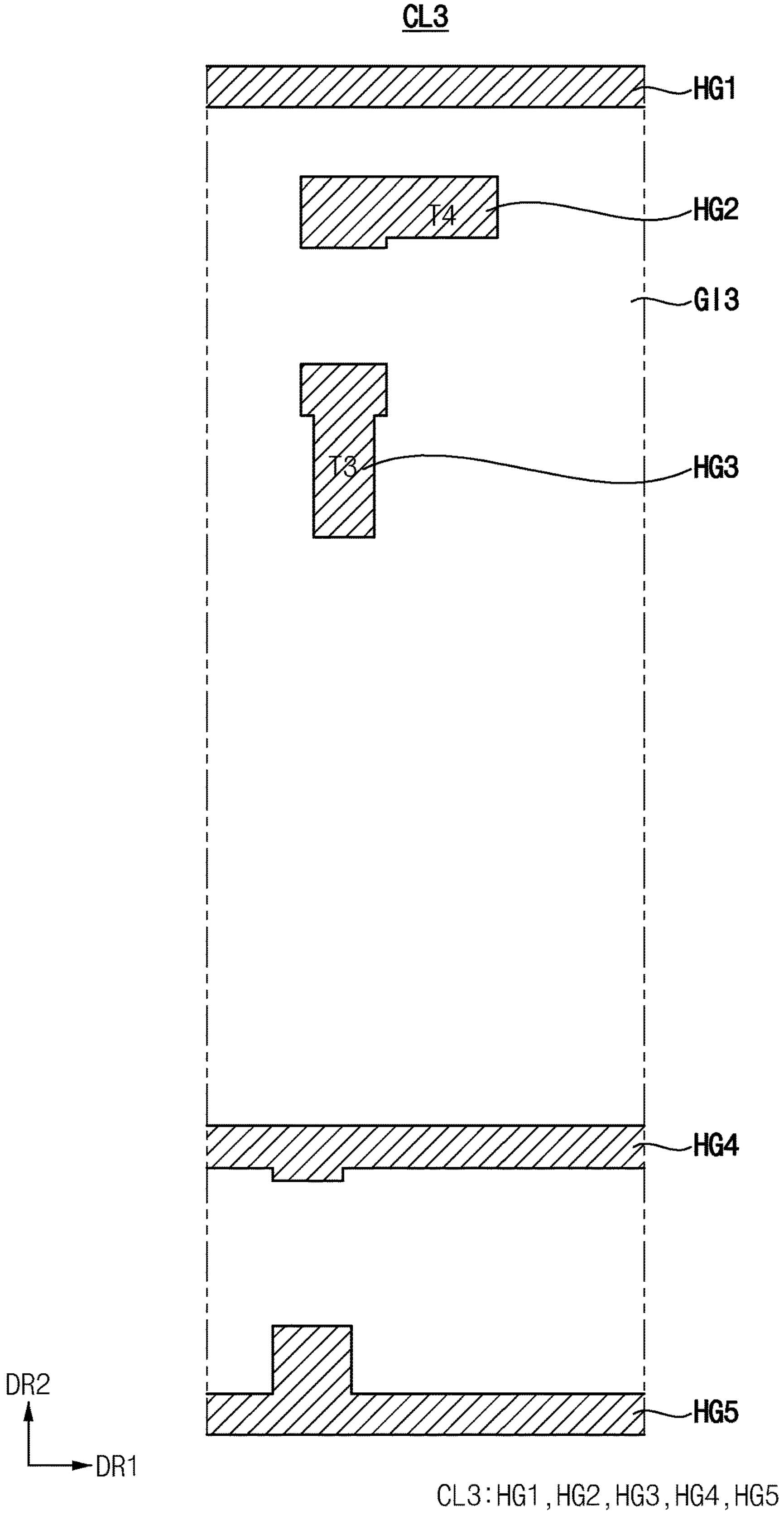
Figure 15:
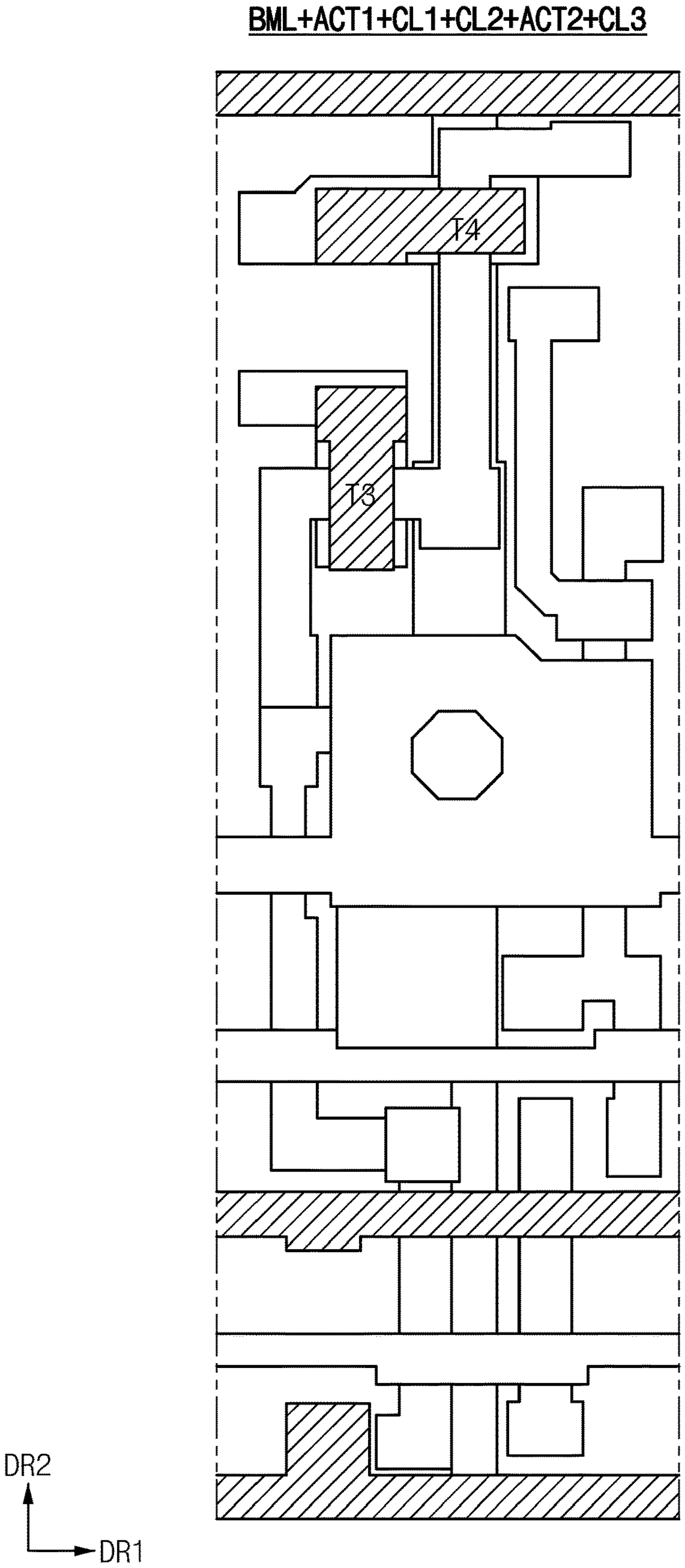

Referring further to FIGS. 14 and 15, a third gate insulating layer GI3 may be disposed on the second active pattern ACT2 and may cover the second active pattern ACT2.

The third gate insulating layer GI3 may include an inorganic insulating material. Examples of the inorganic insulating material that may be used as the third gate insulating layer GI3 may include silicon oxide, silicon nitride, silicon oxynitride, etc. These may be used alone or in combination with each other.

A third conductive layer CL3 may be disposed on the third gate insulating layer GI3. The third conductive layer CL3 may include a first upper gate pattern HG1, a second upper gate pattern HG2, a third upper gate pattern HG3, a fourth upper gate pattern HG4, and a fifth upper gate pattern HG5. The first to fifth upper gate patterns HG1, HG2, HG3, HG4, and HG5 may be disposed on the same layer and may include the same material. The third conductive layer CL3 may include a metal, an alloy, a metal nitride, a conductive metal oxide, a transparent conductive material, etc. These may be used alone or in combination with each other.

The first upper gate pattern HG1 may extend in the first direction DR1. The bias voltage may be provided to the first upper gate pattern HG1. The first upper gate pattern HG1 may be referred to as a second bias voltage line. The first upper gate pattern HG1 may overlap the first lower gate pattern LG1 and may be electrically connected to the first lower gate pattern LG1.

The second upper gate pattern HG2 may be spaced apart from the first upper gate pattern HG1 in the second direction DR2. A part of the third extension portion EP3 and a part of the second upper gate pattern HG2 overlapping the third extension portion EP3 may configure the fourth transistor T4. For example, the second upper gate pattern HG2 may correspond to an upper gate electrode of the fourth transistor T4. The initialization gate signal may be provided to the second upper gate pattern HG2.

The third upper gate pattern HG3 may be spaced apart from the second upper gate pattern HG2 in the second direction DR2. A part of the second extension portion EP2 and a part of the third upper gate pattern HG3 overlapping the second extension portion EP2 may configure the third transistor T3. For example, the third upper gate pattern HG3 may correspond to an upper gate electrode of the third transistor T3. The compensation gate signal may be provided to the third upper gate pattern HG3.

The fourth upper gate pattern HG4 may extend in the first direction DR1 and may be spaced apart from the third upper gate pattern HG3 in the second direction DR2. The fourth upper gate pattern HG4 may increase the yield of a display device. For example, when defects occur in some lines of the line in the manufacturing process of the display device, the fourth upper gate pattern HG4 may replace some of the defective lines.

The fifth upper gate pattern HG5 may extend in the first direction DR1 and may be spaced apart from the fourth upper gate pattern HG4 in the second direction DR2. The anode initialization voltage may be provided to the fifth upper gate pattern HG5. The fifth upper gate pattern HG5 may be referred to a second anode initialization voltage line. The fifth upper gate pattern HG5 may overlap the seventh lower gate pattern LG7 and may be electrically connected to the seventh lower gate pattern LG7.

Figure 16:
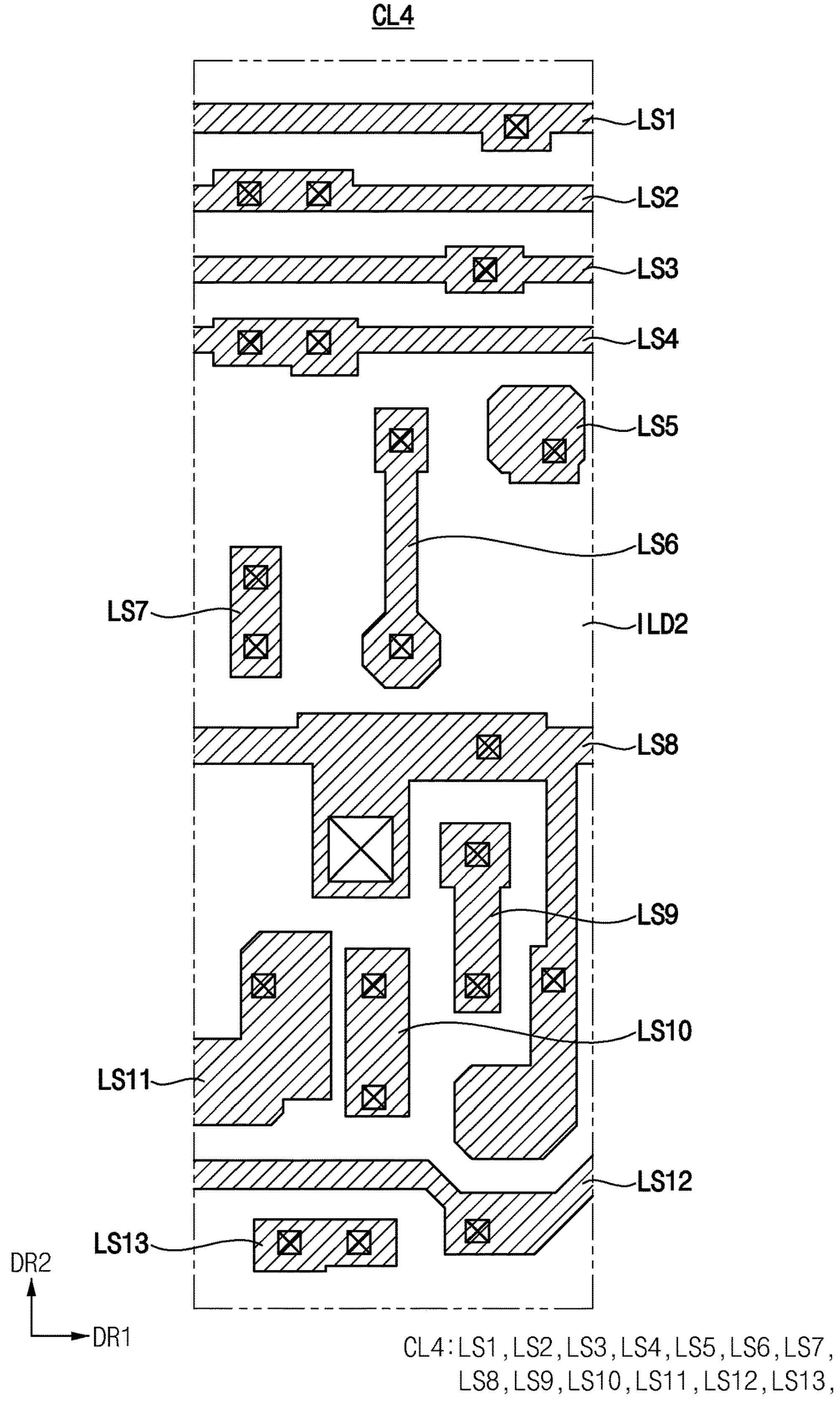
Figure 17:
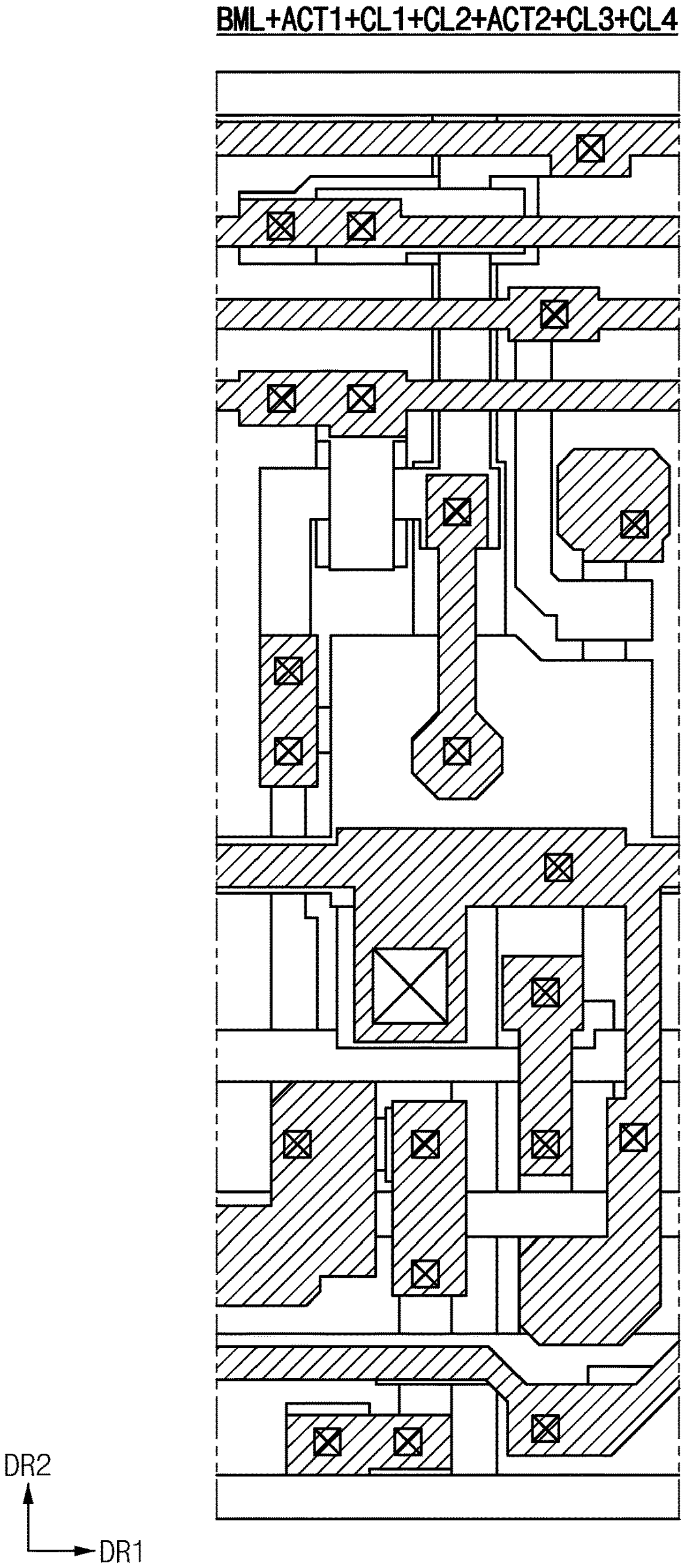

Referring further to FIGS. 16 and 17, A second inter-layer insulating layer ILD2 may be disposed on the third conductive layer CL3 and may cover the third conductive layer CL3.

The second inter-layer insulating layer ILD2 may include an inorganic insulating material. Examples of the inorganic insulating materials that may be used as the second inter-layer insulating layer ILD2 may include silicon oxide, silicon nitride, silicon oxynitride, etc. These may be used alone or in combination with each other.

A fourth conductive layer CL4 may be disposed on the second inter-layer insulating layer ILD2. The fourth conductive layer CL4 may include first to thirteenth lower source patterns LS1, LS2, LS3, LS4, LS5, LS6, LS7, LS8, LS9, LS10, LS11, LS12, and LS13. The first to thirteenth lower source patterns LS1, LS2, LS3, LS4, LS5, LS6, LS7, LS8, LS9, LS10, LS11, LS12, and LS13 may be disposed on the same layer and may include the same material. The fourth conductive layer CL4 may include a metal, an alloy, a metal nitride, a conductive metal oxide, a transparent conductive material, etc. These may be used alone or in combination with each other.

The first lower source pattern LS1 may extend in the first direction DR1. The gate initialization voltage (e.g., the gate initialization voltage VINT of FIG. 3) may be provided to the first lower source pattern LS1. The first lower source pattern LS1 may be connected to the third extension portion EP3 of the second active pattern ACT2 through a contact hole. Accordingly, the gate initialization voltage may be provided to the fourth transistor T4. The first lower source pattern LS1 may be referred to as a gate initialization voltage line.

The second lower source pattern LS2 may extend in the first direction DR1 and may be spaced apart from the first lower source pattern LS1 in the second direction DR2. The initialization gate signal may be provided to the second lower source pattern LS2. The second lower source pattern LS2 may be connected to each of the first intermediate gate pattern MG1 and the second upper gate pattern HG2 through contact holes. Accordingly, the initialization gate signal may be provided to the gate electrode of the fourth transistor T4. The second lower source pattern LS2 may be referred to as an initialization gate line.

The third lower source pattern LS3 may extend in the first direction DR1 and may be spaced apart from the second lower source pattern LS2 in the second direction DR2. The write gate signal may be provided to the third lower source pattern LS3. The third lower source pattern LS3 may be connected to the second lower gate pattern LG2 through a contact hole. Accordingly, the write gate signal may be provided to the gate electrode of the second transistor T2. The third lower source pattern LS3 may be referred to as a write gate line.

The fourth lower source pattern LS4 may extend in the first direction DR1 and may be spaced apart from the third lower source pattern LS3 in the second direction DR2. The compensation gate signal may be provided to the fourth lower source pattern LS4. The fourth lower source pattern LS4 may be connected to each of the second intermediate gate pattern MG2 and the third upper gate pattern HG3 through contact holes. Accordingly, the compensation gate signal may be provided to the gate electrode of the third transistor T3. The fourth lower source pattern LS4 may be referred to as a compensation gate line.

The fifth lower source pattern LS5 may be spaced apart from the fourth lower source pattern LS4 in the second direction DR2. The data voltage (e.g., the data voltage VDATA of FIG. 3) may be provided to the fifth lower source pattern LS5. The fifth lower source pattern LS5 may be connected to the first body portion BP1 of the first active pattern ACT1 through a contact hole. Accordingly, the data voltage may be provided to the second transistor T2. The fifth lower source pattern LS5 may be referred to as a data connection electrode.

The sixth lower source pattern LS6 may extend in the second direction DR2 and may be spaced apart from the fifth lower source pattern LS5 in the first direction DR1. The sixth lower source pattern LS6 may overlap each of the third lower gate pattern LG3 and the third intermediate gate pattern MG3 in a plan view. The sixth lower source pattern LS6 may be connected to each of the third lower gate pattern LG3 and the second body portion BP2 of the second active pattern ACT2 through contact holes. Accordingly, the sixth lower source pattern LS6 may electrically connect the first transistor T1 and the third transistor T3. The sixth lower source pattern LS6 may be referred to as a gate connection electrode.

The seventh lower source pattern LS7 may be spaced apart from the sixth lower source pattern LS6 in the first direction DR1. The seventh lower source pattern LS7 may be connected to each of the first body portion BP1 of the first active pattern ACT1 and the second extension portion EP2 of the second active pattern ACT2 through contact holes. Accordingly, the seventh lower source pattern LS7 may electrically connect the first transistor T1 and the third transistor T3. The seventh lower source pattern LS7 may be referred to as an active connection electrode.

The eighth lower source pattern LS8 may be spaced apart from the seventh lower source pattern LS7 in the second direction DR2. The driving voltage (e.g., the driving voltage ELVDD of FIG. 3) may be provided to the eighth lower source pattern LS8. The eighth lower source pattern LS8 may be connected to each of the first body portion BP1 of the first active pattern ACT1, the third intermediate gate pattern MG3, and the lower pattern BML through contact holes. Accordingly, the driving voltage may be provided to each of the fifth transistor T5, the storage capacitor CST, and the lower pattern BML. The eighth lower source pattern LS8 may be referred to as a driving voltage connection electrode.

The ninth lower source pattern LS9 may extend in the second direction DR2. The ninth lower source pattern LS9 may be connected to each of the first body portion BP1 of the first active pattern ACT1 and the independent part IP of the first active pattern ACT1 through contact holes. Accordingly, the ninth lower source pattern LS9 may electrically connect the fifth transistor T5 and the eighth transistor T8.

The tenth lower source pattern LS10 may extend in the second direction DR2 and may be spaced apart from the ninth lower source pattern LS9 in the first direction DR1. The tenth lower source pattern LS10 may be connected to each of the fifth lower gate pattern LG5 and the first extension portion EP1 of the first active pattern ACT1 through contact holes. Accordingly, the tenth lower source pattern LS10 may electrically connect the seventh transistor T7 and the gate electrode of the ninth transistor T9. In other words, the ninth transistor T9 may be diode-connected.

The eleventh lower source pattern LS11 may be spaced apart from the tenth lower source pattern LS10 in the first direction DR1. The eleventh lower source pattern LS11 may be connected to the first body portion BP1 of the first active pattern ACT1 through a contact hole. The eleventh lower source pattern LS11 may provide the driving current to the light emitting element (e.g., the light emitting element LD of FIG. 3). The eleventh lower source pattern LS11 may be referred to as a first light emitting element connection electrode.

The twelfth lower source pattern LS12 may extend in the first direction DR1 and may be spaced apart from the eleventh lower source pattern LS11 in the second direction DR2. The bias gate signal may be provided to the twelfth lower source pattern LS12. The twelfth lower source pattern LS12 may be connected to the independent portion IP of the first active pattern ACT1 through a contact hole. The bias gate signal may be provided from the independent portion IP of the first active pattern ACT1 to the sixth lower gate pattern LG6. Accordingly, the bias gate signal may be provided to the gate electrode of the seventh transistor T7 and the gate electrode of the eighth transistor T8, respectively. The twelfth lower source pattern LS12 may be referred to as a bias gate line.

The thirteenth lower source pattern LS13 may extend in the first direction DR1. The anode initialization voltage may be provided to the thirteenth lower source pattern LS13. The thirteenth lower source pattern LS13 may be connected to each of the fifth upper gate pattern HG5 and the first extension portion EP1 of the first active pattern ACT1 through contact holes. Accordingly, the anode initialization voltage may be provided to the seventh transistor T7. The thirteenth lower source pattern LS13 may be referred to as an anode initialization voltage connection electrode.

Figure 18:
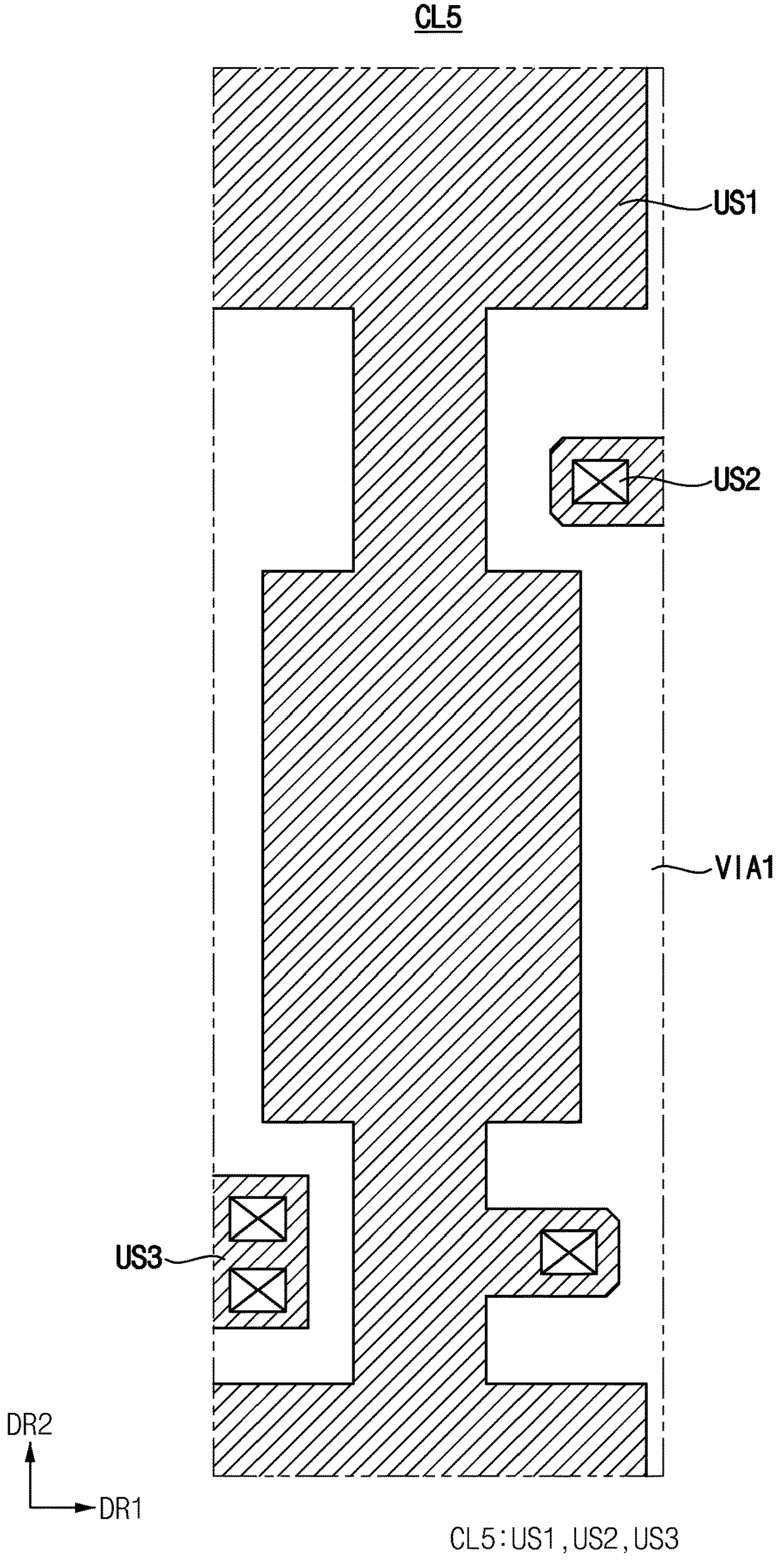
Figure 19:
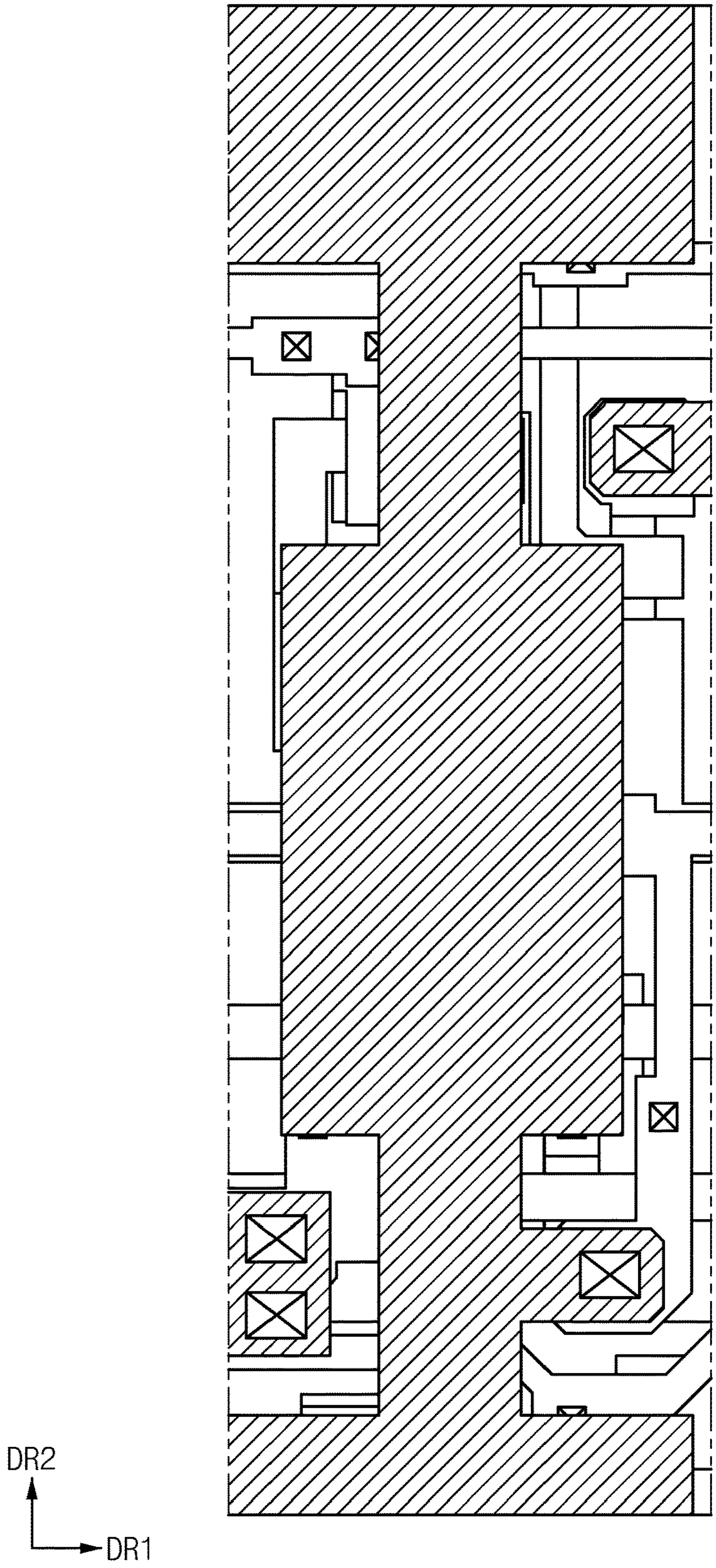

Referring further to FIGS. 18 and 19, a first via insulating layer VIA1 may be disposed on the fourth conductive layer CL4 and may cover the fourth conductive layer CL4.

The first via insulating layer VIA1 may include an organic insulating material. Examples of the organic insulating material that may be used as the first via insulating layer VIA1 may include photoresist, polyacryl-based resin, polyimide-based resin, acryl-based resin, etc. These may be used alone or in combination with each other.

A fifth conductive layer CL5 may be disposed on the first via insulating layer VIA1. The fifth conductive layer CL5 may include a first upper source pattern US1, a second upper source pattern US2, and a third upper source pattern US3. The first to third upper source patterns US1, US2, and US3 may be disposed on the same layer and may include the same material. The fifth conductive layer CL5 may include a metal, an alloy, a metal nitride, a conductive metal oxide, a transparent conductive material, etc. These may be used alone or in combination with each other.

The first upper source pattern US1 may extend in the second direction DR2. The driving voltage may be provided to the first upper source pattern US1. The first upper source pattern US1 may be connected to the eighth lower source pattern LS8 through a contact hole. Accordingly, the driving voltage may be provided to the eighth lower source pattern LS8. The first upper source pattern US1 may be referred to as a driving voltage line.

The second upper source pattern US2 may be spaced apart from the first upper source pattern US1. Although not illustrated in FIGS. 18 and 19, the second upper source pattern US2 may extend in the second direction DR2. Specifically, the second upper source pattern US2 may extend in the second direction DR2 and be connected to each of pixels included in the M-th pixel column.

The data voltage may be provided to the second upper source pattern US2. The second upper source pattern US2 may be connected to the fifth lower source pattern LS5 through a contact hole. Accordingly, the data voltage may be provided to the fifth lower source pattern LS5. The second upper source pattern US2 may be referred to as a data voltage line.

The third upper source pattern US3 may be spaced apart from the second upper source pattern US2. The third upper source pattern US3 may be connected to each of the eleventh lower source pattern LS11 and the anode electrode of the light emitting element through contact holes. The third upper source pattern US3 may provide the driving current to the light emitting element. The third upper source pattern US3 may be referred to as a second light emitting element connection electrode.

A second via insulating layer may be disposed on the fifth conductive layer CL5 and may cover the fifth conductive layer CL5. The second via insulating layer may include an organic insulating material. Examples of the organic insulating material that may be used as the second via insulating layer may include photoresist, polyacryl-based resin, polyimide-based resin, acryl-based resin, etc. These may be used alone or in combination with each other.

The anode electrode (e.g., the anode electrode PE of FIG. 4) may be disposed on the second via insulating layer. The anode electrode may be connected to the third upper source pattern US3 through a contact hole. The anode electrode may include a metal, an alloy, a metal nitride, a conductive metal oxide, a transparent conductive material, etc. These may be used alone or in combination with each other.

Figure 20:
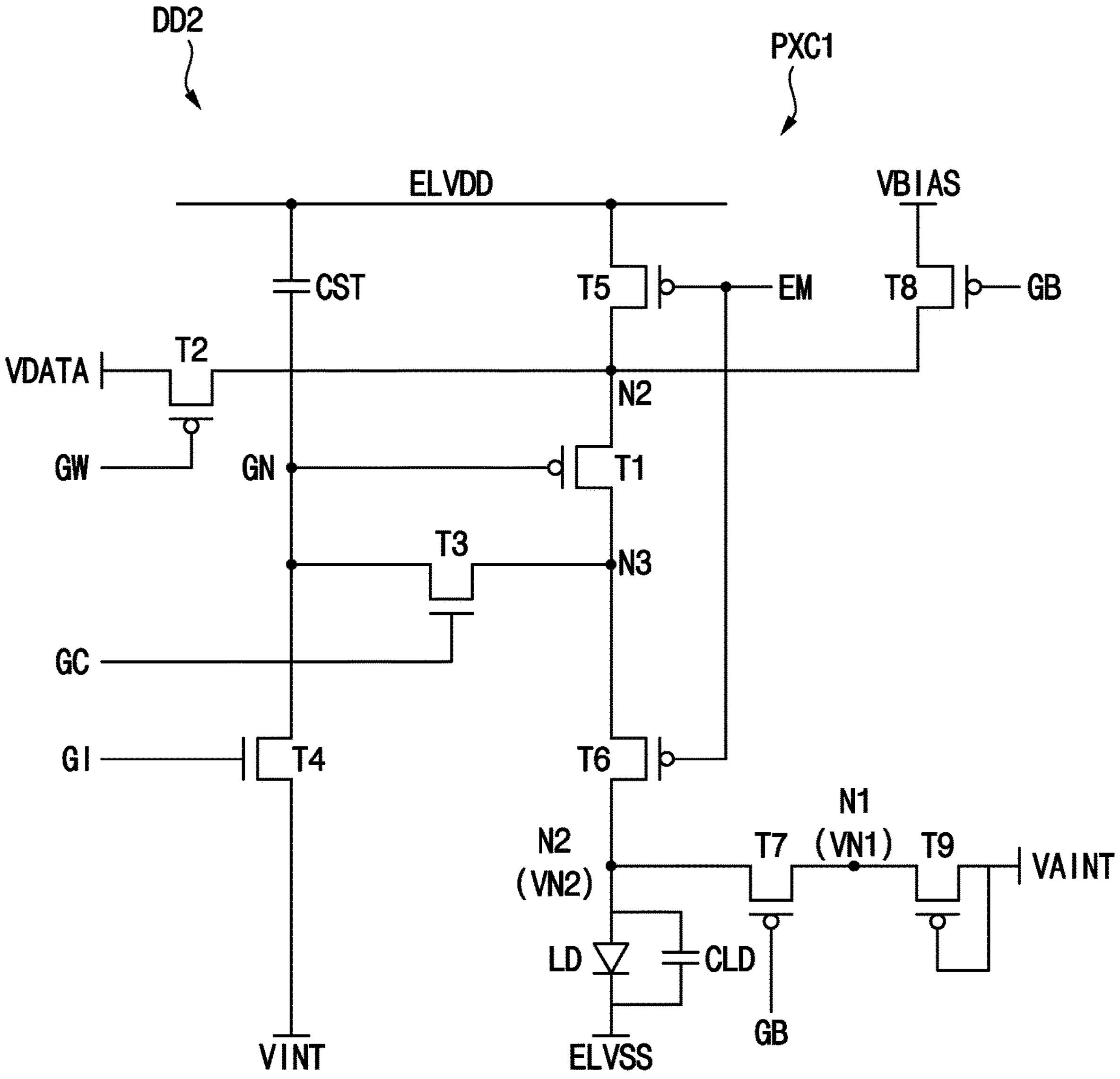
FIG. 20 is a circuit diagram illustrating an example of a sub-pixel included in a display device according to another embodiment of the present disclosure.

FIG. 20 is a circuit diagram illustrating an example of a sub-pixel included in a display device according to another embodiment of the present disclosure. Hereinafter, descriptions overlapping descriptions of the first pixel circuit PXC1 described with reference to FIG. 3 will be omitted or simplified.

Referring to FIG. 20, a first pixel circuit PXC1 of the display device DD2 according to another embodiment of the present disclosure may include first to ninth transistors T1, T2, T3, T4, T5, T6, T7, T8, and T9, a storage capacitor CST, a light emitting element LD, and a light emitting capacitor CLD.

The first pixel circuit PXC1 may be a circuit of a first sub-pixel, a second pixel circuit may be a circuit of a second sub-pixel, and a third pixel circuit may be a circuit of a third sub-pixel. The first sub-pixel may emit a first color of light, the second sub-pixel may emit a second color of light, and the third sub-pixel may emit a third color of light. For example, the second pixel circuit and the third pixel circuit may have substantially the same structure as the first pixel circuit PXC1.

The first pixel circuit PXC1 of the display device DD2 may be substantially the same as the first pixel circuit PXC1 of the display device DD described with reference to FIG. 3, except for the seventh transistor T7 and the ninth transistor T9.

The seventh transistor T7 may include a gate electrode, a first electrode, and a second electrode. The gate electrode of the seventh transistor T7 may receive a bias gate signal GB. The seventh transistor T7 may be turned on or off in response to the bias gate signal GB. The first electrode of the seventh transistor T7 may be connected to a first node N1. The second electrode of the seventh transistor T7 may be connected to a second node N2. While the seventh transistor T7 is turned on, the seventh transistor T7 may provide a voltage of the first node N1 to the second node N2.

The ninth transistor T9 may include a gate electrode, a first electrode, and a second electrode. The gate electrode of the ninth transistor T9 may receive an anode initialization voltage VAINT. The first electrode of the ninth transistor T9 may receive the anode initialization voltage VAINT. In other words, the ninth transistor T9 may be diode-connected. The second electrode of the ninth transistor T9 may be connected to the first node N1.

When a voltage of the first node N1 is defined as VN1, the voltage VN1 of the first node N1 satisfies Equation 2 below.

$$VN1 = VAINT + |Vth|_{T9} \ldots \quad \text{[Equation 2]}$$

Since the ninth transistor T9 is diode-connected, a value obtained by subtracting an absolute value of the threshold voltage of the ninth transistor T9 ($|Vth|_{T9}$) from the voltage VN1 of the first node N1 may be the anode initialization voltage VAINT. In other words, the voltage VN1 of the first node N1 may have a value obtained by adding the absolute value of the threshold voltage of the ninth transistor T9 ($|Vth|_{T9}$) to the anode initialization voltage VAINT.

While the seventh transistor T7 is turned on, the seventh transistor T7 may provide the voltage VN1 of the first node N1 to the second node N2. In other words, the voltage VN2 of the second node N2 may have a value obtained by adding the absolute value of the threshold voltage of the ninth transistor T9 ($|Vth|_{T9}$) to the anode initialization voltage VAINT. That is, the first pixel circuit PXC1, like the first pixel circuit PXC1 of the display device DD illustrated in FIG. 3, may improve the problem of the luminance difference between sub-pixels according to temperature.

Figure 21:
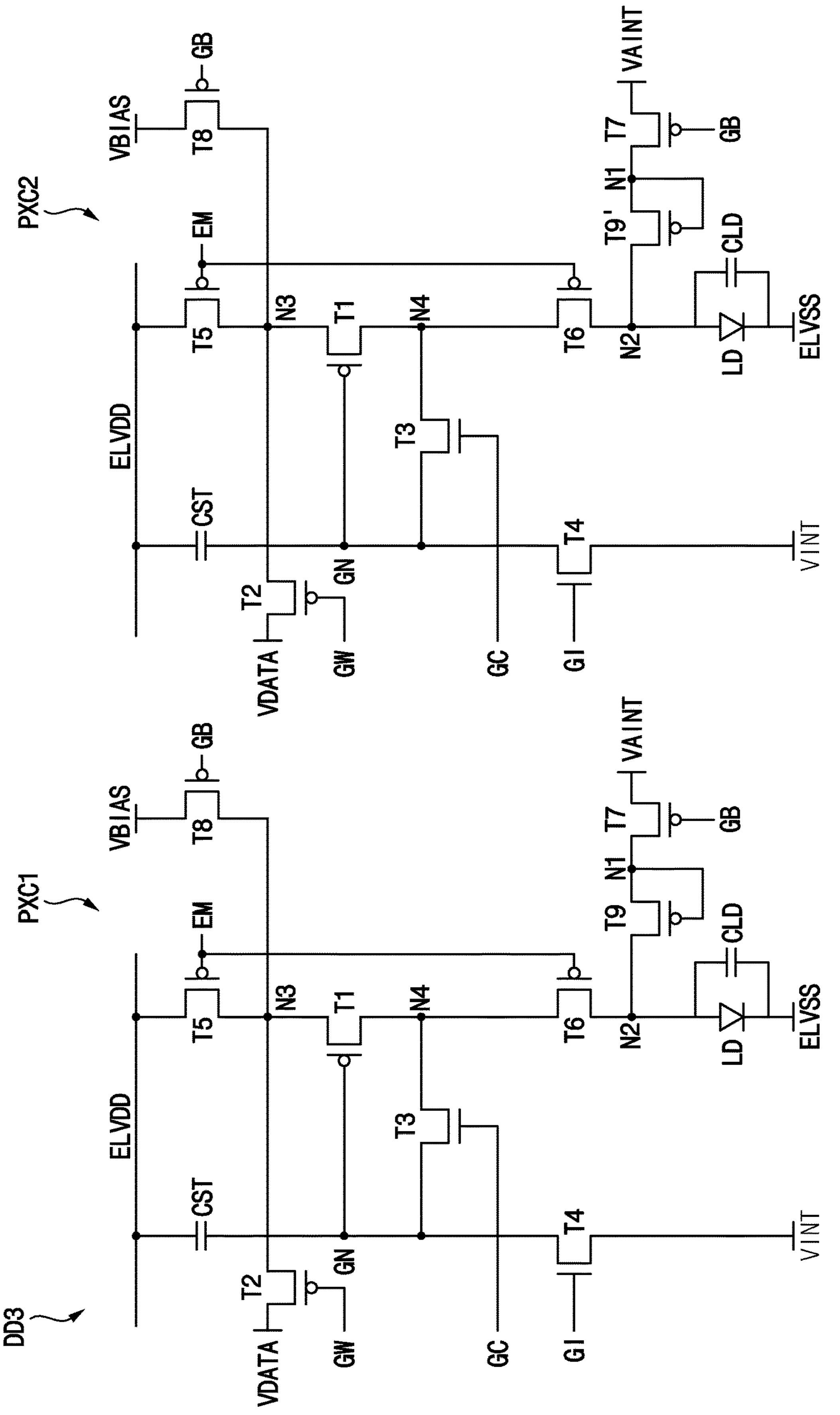
FIG. 21 is a circuit diagram illustrating an example of sub-pixels included in a display device according to still another embodiment of the present disclosure.

FIG. 21 is a circuit diagram illustrating an example of sub-pixels included in a display device according to still another embodiment of the present disclosure. Hereinafter, descriptions overlapping descriptions of the first pixel circuit PXC1 described with reference to FIG. 3 will be omitted or simplified.

Referring to FIG. 21, a display device DD3 according to still another embodiment of the present disclosure may include a first pixel circuit PXC1 and a second pixel circuit PXC2.

The first pixel circuit PXC1 of the display device DD3 may be substantially the same as the first pixel circuit PXC1 of the display device DD described with reference to FIG. 3.

The second pixel circuit PXC2 of the display device DD3 may include first to ninth transistors T1, T2, T3, T4, T5, T6, T7, T8, and T9', a storage capacitor CST, a light emitting element LD, and a light emitting capacitor CLD.

For example, the first pixel circuit PXC1 may be a circuit of a first sub-pixel, and the second pixel circuit PXC2 may be a circuit of a second sub-pixel. In addition, a circuit of a third sub-pixel may be the first pixel circuit PXC1 or the second pixel circuit PXC2. The first sub-pixel may emit a first color of light, the second sub-pixel may emit a second color of light, and the third sub-pixel may emit a third color of light.

In an embodiment, a ratio of a channel width to a channel length (W/L ratio) of the ninth transistor T9' included in the second pixel circuit PXC2 may be different from a ratio of a channel width to a cannel length of the ninth transistor T9 included in the first pixel circuit PXC1. The threshold voltage of the ninth transistor may be adjusted by adjusting the ratio of the channel width to the channel length of the ninth transistor. By adjusting the threshold voltage of the ninth transistor, voltages of the second node N2 of pixel circuits including light emitting element LD emitting different lights may be differentially adjusted. Accordingly, the problem of the luminance difference between sub-pixels emitting different lights may be improved.

Figure 22:
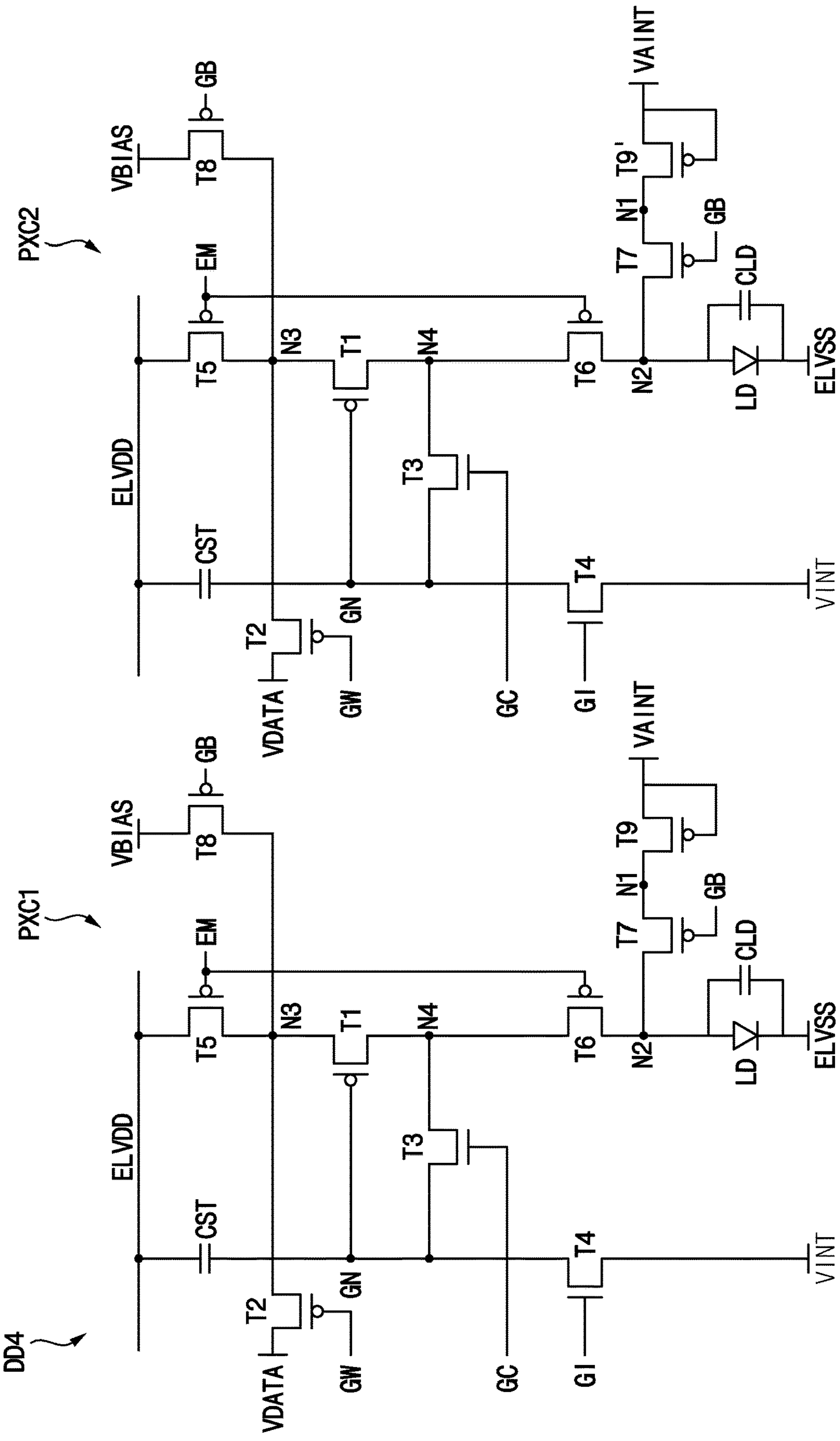
FIG. 22 is a circuit diagram illustrating an example of sub-pixels included in a display device according to still another embodiment of the present disclosure.

FIG. 22 is a circuit diagram illustrating an example of sub-pixels included in a display device according to still another embodiment of the present disclosure. Hereinafter, descriptions overlapping with descriptions of the first pixel circuit PXC1 described with reference to FIG. 20 will be omitted or simplified.

Referring to FIG. 22, a display device DD4 according to still another embodiment of the present disclosure may include a first pixel circuit PXC1 and a second pixel circuit PXC2.

The first pixel circuit PXC1 of the display device DD4 may be substantially the same as the first pixel circuit PXC1 of the display device DD2 described with reference to FIG. 20.

The second pixel circuit PXC2 of the display device DD4 may include first to ninth transistors T1, T2, T3, T4, T5, T6, T7, T8, and T9', a storage capacitor CST, a light emitting element LD, and a light emitting capacitor CLD.

For example, the first pixel circuit PXC1 may be a circuit of a first sub-pixel, and the second pixel circuit PXC2 may be a circuit of a second sub-pixel. In addition, a circuit of a third sub-pixel may be the first pixel circuit PXC1 or the second pixel circuit PXC2. The first sub-pixel may emit a first light, the second sub-pixel may emit a second light, and the third sub-pixel may emit a third light.

In an embodiment, a ratio of a channel width to a channel length (W/L ratio) of the ninth transistor T9' included in the second pixel circuit PXC2 may be different from a ratio of a channel width to a cannel length of the ninth transistor T9 included in the first pixel circuit PXC1.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of the embodiments of the present disclosure, and is not to be construed as limiting thereof. Although a few embodiments have been described with reference to the figures, those skilled in the art will readily appreciate that many variations and modifications may be made therein without departing from the spirit and scope of the present disclosure as defined in the appended claims.

What is claimed is:

1. A display device comprising:

a first pixel circuit and a second pixel circuit, wherein the first pixel circuit comprises:

a driving transistor generating a driving current;

a temperature compensation transistor including a first electrode connected to a first node receiving an anode initialization voltage, a gate electrode connected to the first node, and a second electrode connected to a second node, the temperature compensation transistor being connected to the driving transistor through the second node;

and a light emitting element connected to the temperature compensation transistor through the second node and emitting light according to the driving current, wherein the second pixel circuit comprises:

a second driving transistor generating a second driving current;

a second temperature compensation transistor including a first electrode connected to a first node of the second pixel circuit, a gate electrode connected to the first node of the second pixel circuit, and a second electrode connected to a second node of the second pixel circuit, the second temperature compensation transistor being connected to the second driving transistor through the second node of the second pixel circuit; and a second light emitting element connected to the second temperature compensation transistor through the second node of the second pixel circuit and emitting light according to the second driving current, and wherein a ratio of a channel width to a channel length (W/L ratio) of the temperature compensation transistor included in the first pixel circuit is different from a ratio of a channel width to a channel length of the second temperature compensation transistor included in the second pixel circuit.

2. The display device of claim 1, wherein the temperature compensation transistor is a PMOS transistor.

3. The display device of claim 1, wherein the first pixel circuit further includes an anode initialization transistor including a first electrode receiving the anode initialization voltage, a gate electrode receiving a bias gate signal, and a second electrode connected to the first node, and wherein the anode initialization transistor is connected to the temperature compensation transistor through the first node.

4. The display device of claim 3, wherein a voltage provided to the second node is greater than the anode initialization voltage.

5. The display device of claim 4, wherein a voltage provided to the second node when driven at a first temperature is greater than a voltage provided to the second node when driven at a second temperature greater than the first temperature.

6. The display device of claim 3, wherein the driving transistor includes a first electrode connected to a third node, a gate electrode connected to a gate node, and a second electrode connected to a fourth node, and wherein the first pixel circuit further includes a compensation transistor including a first electrode connected to the gate node, a gate electrode receiving a compensation gate signal, and a second electrode connected to the fourth node, and wherein the compensation transistor is connected to the driving transistor through the fourth node and the gate node.

7. The display device of claim 6, wherein the first pixel circuit further includes a gate initialization transistor including a first electrode receiving a gate initialization voltage, a gate electrode receiving an initialization gate signal, and a second electrode connected to the gate node, and wherein the gate initialization transistor is connected to each of the compensation transistor and the driving transistor through the gate node.

8. The display device of claim 7, wherein each of the compensation transistor and the gate initialization transistor is an NMOS transistor.

9. The display device of claim 7, wherein the first pixel circuit further includes a first light emitting transistor and a second light emitting transistor, wherein the first light emitting transistor includes a first electrode receiving a driving voltage, a gate electrode receiving a light emitting control signal, and a second electrode connected to the third node, and the second light emitting transistor includes a first electrode connected to the fourth node, a gate electrode receiving the light emitting control signal, and a second electrode connected to the second node, wherein the first light emitting transistor is connected to the driving transistor through the third node and the second light emitting transistor is connected to the driving transistor through the fourth node.

10. The display device of claim 9, wherein the first pixel circuit further includes a writing transistor and an initialization transistor, wherein the writing transistor includes a first electrode receiving a data voltage, a gate electrode receiving a write gate signal, and a second electrode connected to the third node, wherein the initialization transistor includes a first electrode receiving a bias voltage, a gate electrode receiving the bias gate signal, and a second electrode connected to the third node, and wherein the writing transistor is connected to the driving transistor through the third node and the initialization transistor is connected to the driving transistor through the third node.

11. A display device comprising:

a first pixel circuit and a second pixel circuit, wherein the first pixel circuit comprises:

a driving transistor generating a driving current;

an anode initialization transistor including a first electrode connected to a first node, a gate electrode receiving a bias gate signal, and a second electrode connected to a second node, the anode initialization transistor being connected to the driving transistor through the second node;

a temperature compensation transistor including a first electrode receiving an anode initialization voltage, a gate electrode receiving the anode initialization voltage, and a second electrode connected to the first node, the temperature compensation transistor being connected to the anode initialization transistor through the first node; and a light emitting element connected to the anode initialization transistor through the second node and emitting light according to the driving current, wherein the second pixel circuit comprises:

a second driving transistor generating a second driving current;

a second anode initialization transistor including a first electrode connected to a first node of the second pixel circuit, a gate electrode receiving the bias gate signal, and a second electrode connected to a second node of the second pixel circuit, the second anode initialization transistor being connected to the second driving transistor through the second node;

a second temperature compensation transistor including a first electrode receiving the anode initialization voltage, a gate electrode receiving the anode initialization voltage, and a second electrode connected to the first node of the second pixel circuit, the second temperature compensation transistor being connected to the second anode initialization transistor through the first node of the second pixel circuit; and a second light emitting element connected to the second anode initialization transistor through the second node of the second pixel circuit and emitting light according to the second driving current, and wherein a ratio of a channel width to a channel length (W/L ratio) of the temperature compensation transistor included in the first pixel circuit is different from a ratio of a channel width to a channel length of the second temperature compensation transistor included in the second pixel circuit.

12. The display device of claim 11, wherein the temperature compensation transistor is a PMOS transistor.

13. The display device of claim 11, wherein a voltage provided to the second node is greater than the anode initialization voltage.

14. The display device of claim 13, wherein a voltage provided to the second node when driven at a first temperature is greater than a voltage provided to the second node when driven at a second temperature greater than the first temperature.

15. The display device of claim 11, wherein the driving transistor includes a first electrode connected to a third node, a gate electrode connected to a gate node, and a second electrode connected to a fourth node, and wherein the first pixel circuit further includes a compensation transistor and a gate initialization transistor, wherein the compensation transistor includes a first electrode connected to the gate node, a gate electrode receiving a compensation gate signal, and a second electrode connected to the fourth node, wherein the gate initialization transistor includes a first electrode receiving a gate initialization voltage, a gate electrode receiving an initialization gate signal, and a second electrode connected to the gate node, and wherein the compensation transistor is connected to the driving transistor through the fourth node and the gate node, and the gate initialization transistor is connected to each of the compensation transistor and the driving transistor through the gate node.

16. The display device of claim 15, wherein each of the compensation transistor and the gate initialization transistor is an NMOS transistor.

17. The display device of claim 15, wherein the first pixel circuit further includes a first light emitting transistor and a second light emitting transistor, wherein the first light emitting transistor includes a first electrode receiving a driving voltage, a gate electrode receiving a light emitting control signal, and a second electrode connected to the third node, wherein the second light emitting transistor includes a first electrode connected to the fourth node, a gate electrode receiving the light emitting control signal, and a second electrode connected to the second node, and wherein the first light emitting transistor is connected to the driving transistor through the third node and the second light emitting transistor is connected to the driving transistor through the fourth node.

18. The display device of claim 17, wherein the first pixel circuit further includes a writing transistor and an initialization transistor, wherein the writing transistor includes a first electrode receiving a data voltage, a gate electrode receiving a write gate signal, and a second electrode connected to the third node, wherein the initialization transistor includes a first electrode receiving a bias voltage, a gate electrode receiving the bias gate signal, and a second electrode connected to the third node, and wherein the writing transistor is connected to the driving transistor through the third node and the initialization transistor is connected to the driving transistor through the third node.

* * * * *